(12) United States Patent
Hrenchir et al.

(10) Patent No.: US 12,032,011 B2
(45) Date of Patent: Jul. 9, 2024

(54) INSULATING BLOCK CONFIGURED FOR TOOL-FREE INSTALLATION IN AN ELECTRICAL ASSEMBLY

(71) Applicant: MILBANK MANUFACTURING CO., Kansas City, MO (US)

(72) Inventors: Emily Hrenchir, Olathe, KS (US); Brian Hagen, Raytown, MO (US); Doug Leach, Parkville, MO (US); William McCarthy, Kansas City, MO (US)

(73) Assignee: MILBANK MANUFACTURING CO., Kansas City, MO (US)

( * ) Notice: Subject to any disclaimer, the term of this patent is extended or adjusted under 35 U.S.C. 154(b) by 950 days.

(21) Appl. No.: 16/945,033

(22) Filed: Jul. 31, 2020

(65) Prior Publication Data
US 2022/0034940 A1    Feb. 3, 2022

(51) Int. Cl.
| | |
|---|---|
| *H02B 1/03* | (2006.01) |
| *G01R 3/00* | (2006.01) |
| *G01R 11/04* | (2006.01) |
| *H02B 1/32* | (2006.01) |
| *H02B 1/30* | (2006.01) |

(52) U.S. Cl.
CPC ............... *G01R 3/00* (2013.01); *G01R 11/04* (2013.01); *H02B 1/03* (2013.01); *H02B 1/32* (2013.01); *H02B 1/305* (2013.01)

(58) Field of Classification Search
None
See application file for complete search history.

(56) References Cited

U.S. PATENT DOCUMENTS

| | | | | |
|---|---|---|---|---|
| 6,362,952 B1 * | 3/2002 | Schoonover | ........... | H02B 1/056 439/573 |
| 7,559,793 B1 * | 7/2009 | Zhang | .................. | H01R 13/422 439/517 |
| 7,614,908 B2 * | 11/2009 | Zhang | .................... | G01R 11/04 439/744 |
| 7,785,137 B2 * | 8/2010 | Porter | .................... | G01R 11/04 439/517 |

(Continued)

FOREIGN PATENT DOCUMENTS

| | | |
|---|---|---|
| CA | 2878770 A1 | 7/2015 |
| CA | 2998755 A1 | 9/2018 |

(Continued)

*Primary Examiner* — Courtney L Smith
(74) *Attorney, Agent, or Firm* — STINSON LLP

(57) ABSTRACT

An insulating block configured for attachment to an electrical structure without the use of a tool. The insulating block is formed from an electrical insulator. One of the electrical structure and the insulating block may have a clip that is configured to engage a catch surface on the other of the electrical structure and the insulating block without the use of a tool. An opening or recess of the electrical structure may be configured to receive a portion of the insulating block having the clip or catch surface, and the portion of the insulating block may move within the opening or recess from a disengaged position to an engaged position, in which the clip engages the catch surface to securely attach the insulating block to the electrical structure. The electrical structure may be a meter socket enclosure. The combination of the insulating block with the electrical structure.

18 Claims, 27 Drawing Sheets

(56) References Cited

U.S. PATENT DOCUMENTS

| | | | | |
|---|---|---|---|---|
| 7,850,483 B2 * | 12/2010 | Siglock | ................. | H01R 33/94 |
| | | | | 439/517 |
| 8,602,814 B2 * | 12/2013 | Packard, III | ........... | G01R 11/04 |
| | | | | 439/517 |
| 9,502,793 B2 | 11/2016 | Iwata et al. | | |
| 10,340,614 B2 | 7/2019 | Fukui | | |
| 10,510,226 B2 * | 12/2019 | Siglock | ................. | G08B 13/06 |
| 2006/0178044 A1 * | 8/2006 | Johnson | ................ | G01R 11/04 |
| | | | | 439/517 |
| 2013/0273772 A1 * | 10/2013 | Zhang | ..................... | H02B 1/03 |
| | | | | 439/517 |

FOREIGN PATENT DOCUMENTS

| | | |
|---|---|---|
| CN | 103779696 B | 2/2016 |
| CN | 104851698 B | 4/2017 |
| CN | 207217814 U | 4/2018 |
| CN | 110190430 A | 8/2019 |
| CN | 209266645 U | 8/2019 |
| CN | 209266664 U | 8/2019 |
| DE | 102018100954 A1 | 7/2019 |

* cited by examiner

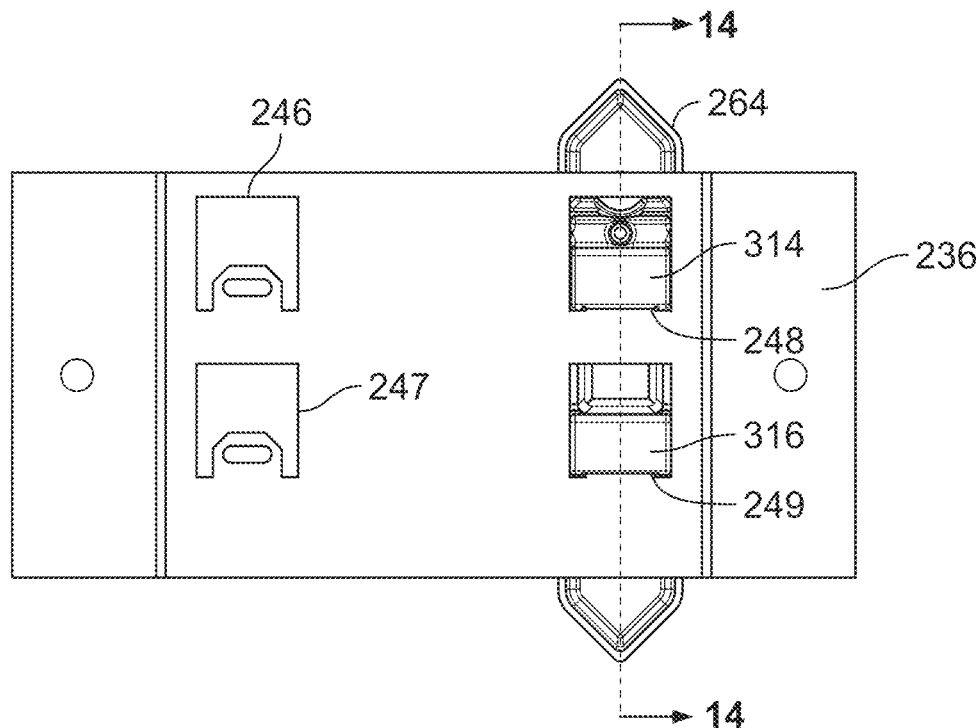
FIG. 13
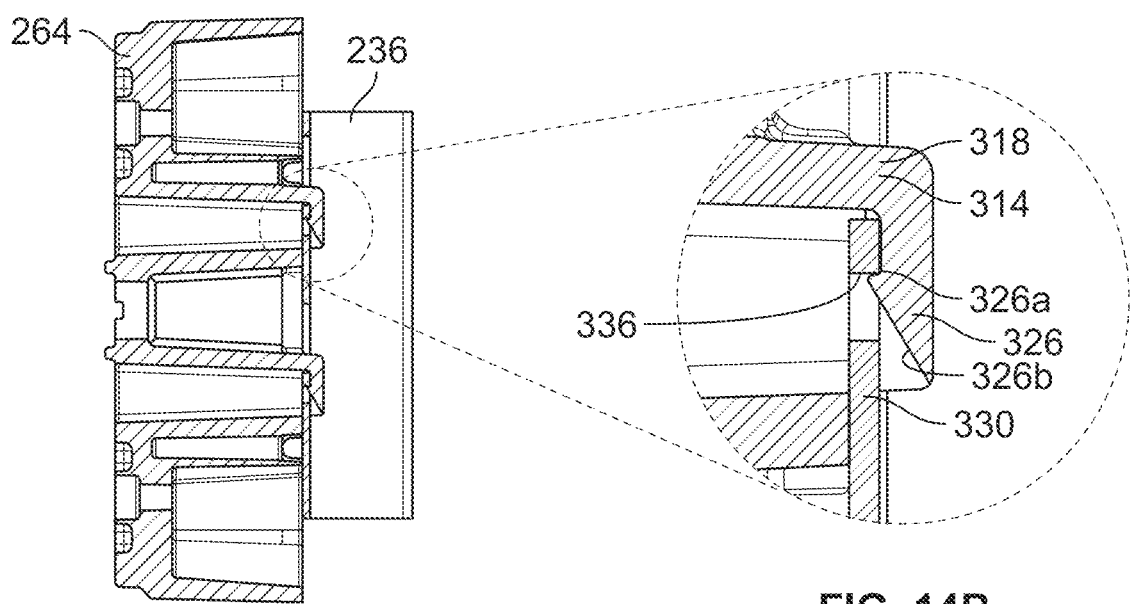
FIG. 14B
FIG. 14A

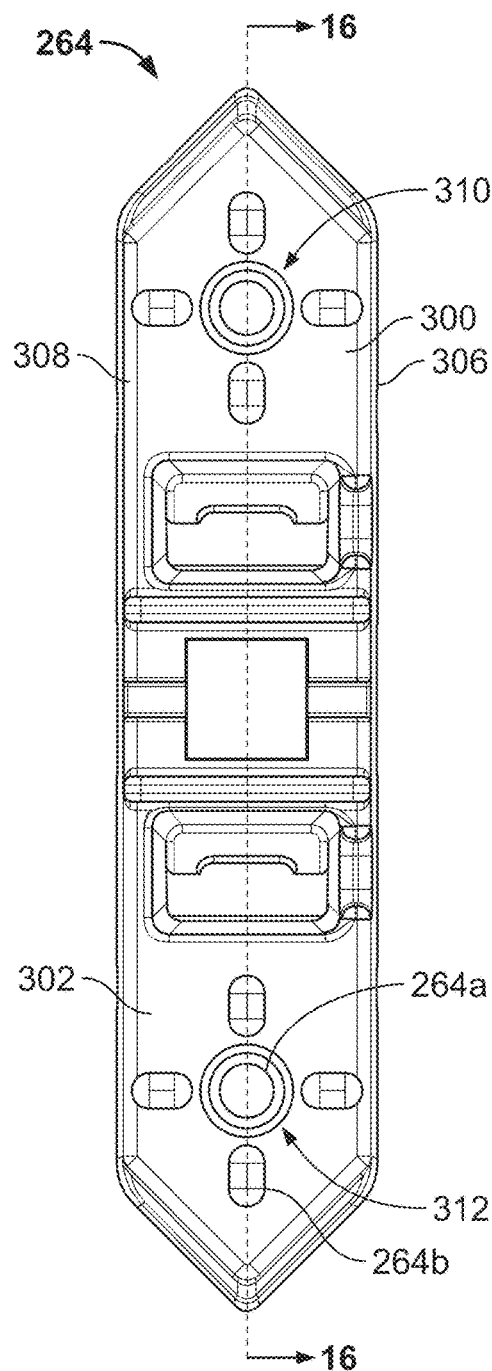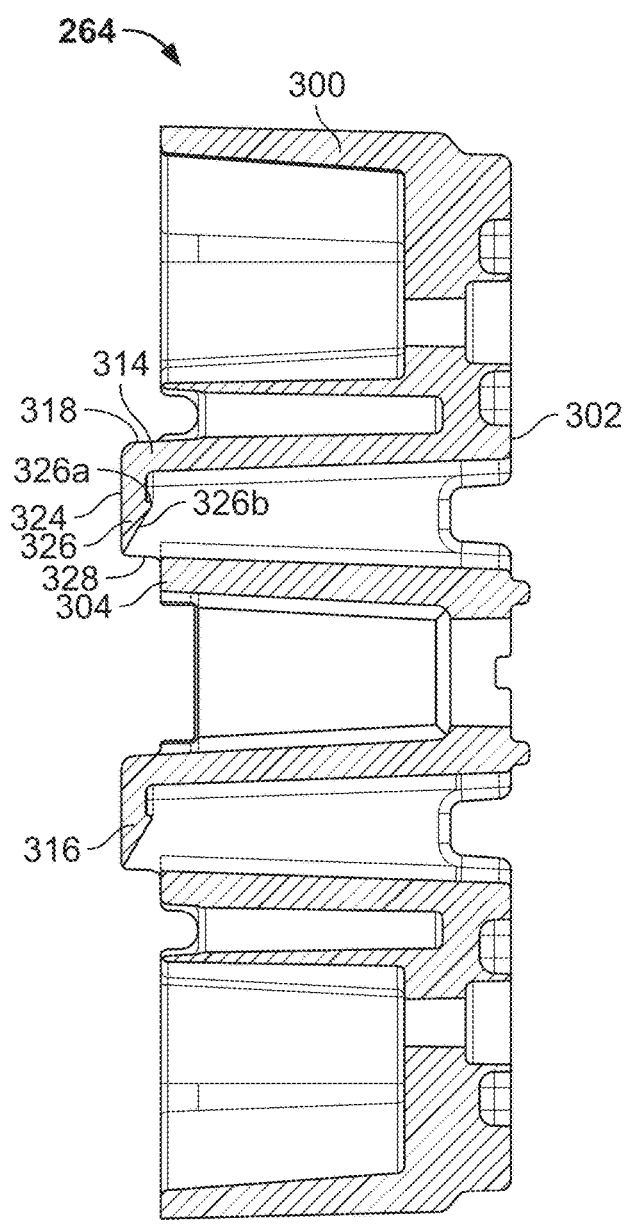
FIG. 15
FIG. 16

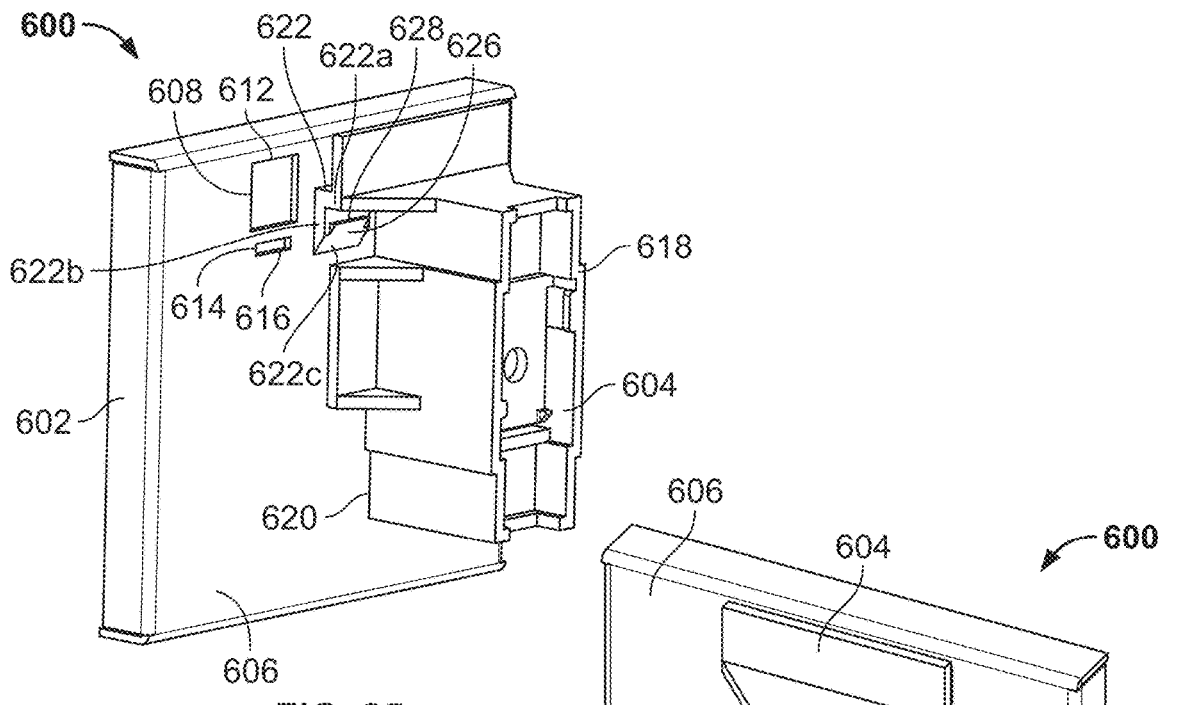
FIG. 25
FIG. 26
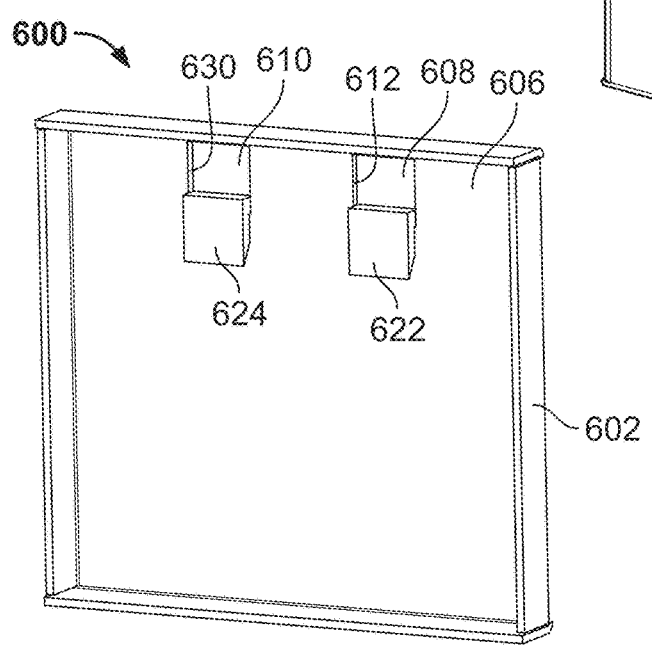
FIG. 27

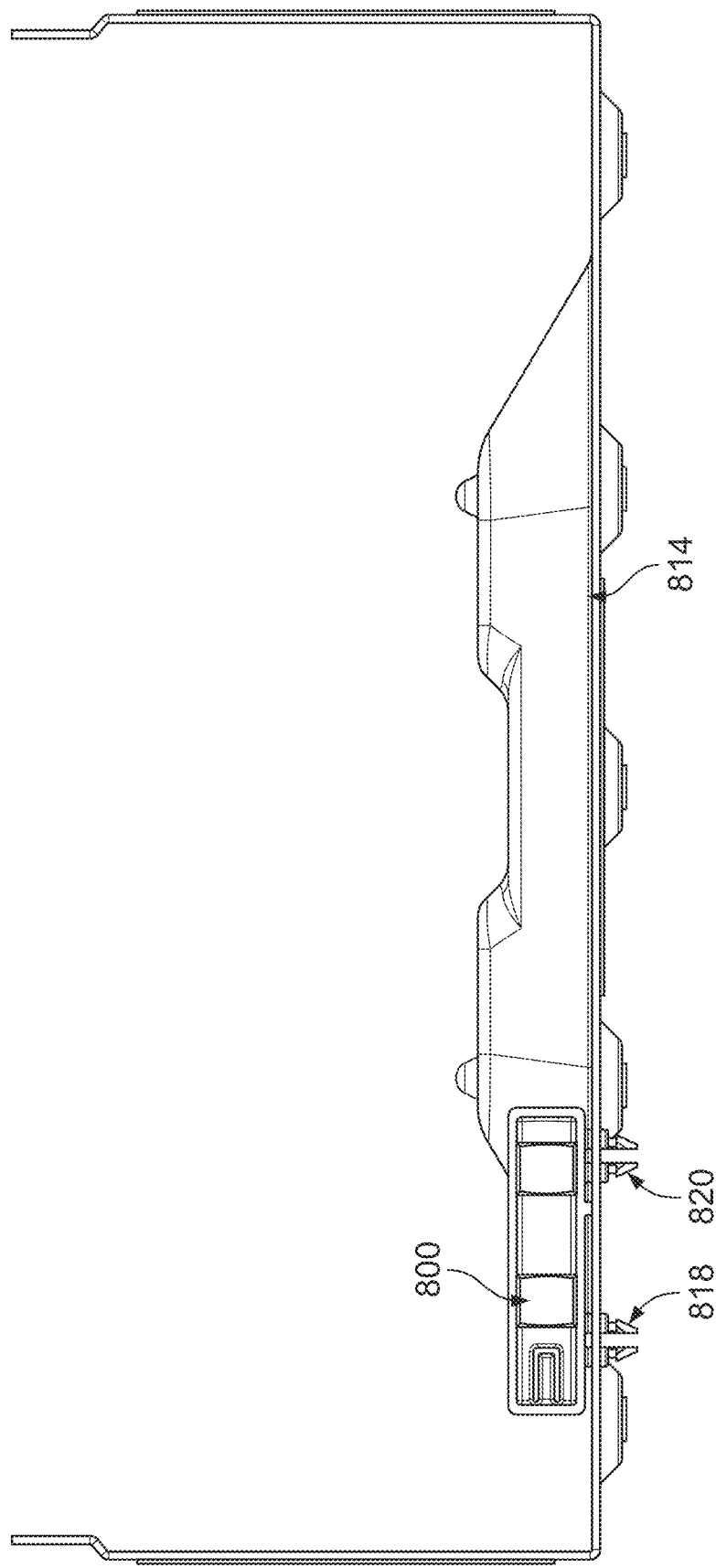

INSULATING BLOCK CONFIGURED FOR TOOL-FREE INSTALLATION IN AN ELECTRICAL ASSEMBLY

CROSS-REFERENCE TO RELATED APPLICATIONS

Not applicable.

BACKGROUND OF THE INVENTION

Electrical boxes, such as meter boxes, typically have an insulating block that is joined to a wall or panel of the box to safely space an electrical connector from the box. The insulating block is typically joined to the box with fasteners, such as screws, that require the use of a tool. For example, FIG. 1 shows an insulating block 10 that is mounted to a rear panel 12 of a meter socket enclosure 14. The insulating block 10 has openings 16a-b that receive screws (not shown) for mounting the insulating block 10 to threaded openings (not shown) in the rear panel 12. Two electrical connectors 18a-b are mounted to the insulating block 10 to space the electrical connectors 18a-b from the rear panel 12. Another insulating block 20 (see FIG. 2), like insulating block 10, mounts to the rear panel 12 using threaded openings 22a and 22b. As shown in FIG. 2, the insulating block 20 has two openings 24a and 24b for receiving screws (not shown). The screws are inserted through the openings 24a and 24b and engage the threaded openings 22a and 22b shown in FIG. 1 to mount the insulating block 20 to the rear panel 12.

While insulating blocks 10 and 20 are generally suitable for their intended use, they require the use of separate fasteners and a tool, such as a screwdriver, to join them to the enclosure 14. The separate fasteners increase the cost of installing the enclosure, and the need for a separate tool for installation requires the installer to locate and carry the correct tool. Further, it may be difficult to hold the insulating block in place with one hand, while using the other hand to insert the fasteners into the aligned openings and screw the fasteners in place. The installer may drop or lose one of the fasteners, which then increases the installation time as the installer must pick up or locate another fastener to install. In addition, if one of the fasteners is lost inside of the enclosure, the fastener may create an electrically conductive path between two components in an undesired and potentially unsafe manner.

BRIEF SUMMARY OF THE INVENTION

One embodiment of the invention is directed toward an insulating block configured for use with a meter socket enclosure. The insulating block has a base that is formed from a material that is an electrical insulator. The base has a first attachment structure that is configured to engage a surface of the meter socket enclosure to securely attach the base to the meter socket enclosure. The first attachment structure and the surface of the meter socket enclosure are configured so that the first attachment structure engages the surface of the meter socket enclosure without the use of a tool. The base also has a second attachment structure that is configured for attachment to an electrical connector.

In some embodiments, the first attachment structure of the insulating block is a clip, and the meter socket enclosure has a recess or opening positioned adjacent a catch surface. The recess or opening is configured to receive a portion of the first attachment structure, and the first attachment structure is configured to move within the recess or opening from a disengaged position, in which the clip does not engage the catch surface, to an engaged position, in which the clip engages the catch surface.

In some embodiments, the first attachment structure of the insulating block is a catch surface, and the meter socket enclosure has a recess or opening positioned adjacent a clip. The recess or opening is configured to receive a portion of the first attachment structure, and the first attachment structure is configured to move within the recess or opening from a disengaged position, in which the clip does not engage the catch surface, to an engaged position, in which the clip engages the catch surface.

Another embodiment of the invention is directed toward a meter socket including a meter socket enclosure and an insulating block formed from a material that is an electrical insulator. The meter socket enclosure has a first attachment structure, and the insulating block has a second attachment structure that is configured to engage the first attachment structure to securely attach the insulating block to the meter socket enclosure. The first attachment structure and the second attachment structure are configured so that the second attachment structure engages the first attachment structure without the use of a tool.

In some embodiments, the first attachment structure of the meter socket enclosure is a catch surface, and the second attachment structure of the insulating block is a clip. The meter socket enclosure has a recess or opening positioned adjacent the catch surface. The recess or opening is configured to receive a portion of the second attachment structure, and the second attachment structure is configured to move within the recess or opening from a disengaged position, in which the clip does not engage the catch surface, to an engaged position, in which the clip engages the catch surface.

In some embodiments, the first attachment structure of the meter socket enclosure is a clip, and the second attachment structure of the insulating block is a catch surface. The meter socket enclosure has a recess or opening positioned adjacent the clip. The recess or opening is configured to receive a portion of the second attachment structure, and the second attachment structure is configured to move within the recess or opening from a disengaged position, in which the clip does not engage the catch surface, to an engaged position, in which the clip engages the catch surface.

Yet another embodiment of the invention described herein is directed toward an assembly including an attachment structure defining an opening or recess, and an insulating block formed from a material that is an electrical insulator. One of the attachment structure and the insulating block comprises a clip that is configured to engage a catch surface on the other of the attachment structure and the insulating block without the use of a tool. The opening or recess is configured to receive a portion of the insulating block comprising the clip or catch surface, and the portion of the insulating block is configured to move within the opening or recess from a disengaged position, in which the clip does not engage the catch surface, to an engaged position, in which the clip engages the catch surface to securely attach the insulating block to the attachment structure.

In some embodiments, the attachment structure includes the catch surface and the insulating block includes the clip. The opening or recess of the attachment structure is configured to receive the clip, and the clip is configured to move within the opening or recess from a disengaged position, in which the clip does not engage the catch surface, to an engaged position, in which the clip engages the catch surface.

In some embodiments, the attachment structure includes the clip and the insulating block includes the catch surface. The opening or recess of the attachment structure is configured to receive a portion of the insulating block comprising the catch surface, and the portion of the insulating block is configured to move within the recess or opening from a disengaged position, in which the clip does not engage the catch surface, to an engaged position, in which the clip engages the catch surface.

Additional aspects of the invention, together with the advantages and novel features appurtenant thereto, will be set forth in part in the description which follows, and in part will become apparent to those skilled in the art upon examination of the following, or may be learned from the practice of the invention. The objects and advantages of the invention may be realized and attained by means of the instrumentalities and combinations particularly pointed out in the appended claims.

BRIEF DESCRIPTION OF THE DRAWINGS

Various exemplary embodiments of the present invention are described in detail below with reference to the attached drawing figures, wherein:

FIG. 13 is a rear elevational view of the riser structure and insulating block shown in FIG. 11 showing the insulating block in an engaged position;

FIG. 14A is a cross-sectional view taken through the line 14-14 of FIG. 13;

FIG. 14B is a detail view of a portion of FIG. 14A;

FIG. 15 is a front elevational view of the insulating block shown in FIG. 11;

FIG. 16 is a cross-sectional view taken through the line 16-16 of FIG. 15;

FIG. 25 is a perspective view of an electrical assembly in accordance with an alternative embodiment of the invention showing an insulating block for use with an isolated neutral conductor prior to its attachment to a bridge;

FIG. 26 is a perspective view of the electrical assembly shown in FIG. 25 showing the insulating block attached to the bridge;

FIG. 27 is a rear perspective view of the electrical assembly shown in FIG. 26;

FIG. 37 is a bottom view of the electrical enclosure shown in FIG. 36 showing the meter socket bubble level attached to the enclosure.

DETAILED DESCRIPTION OF EXEMPLARY EMBODIMENTS

Figure 1:
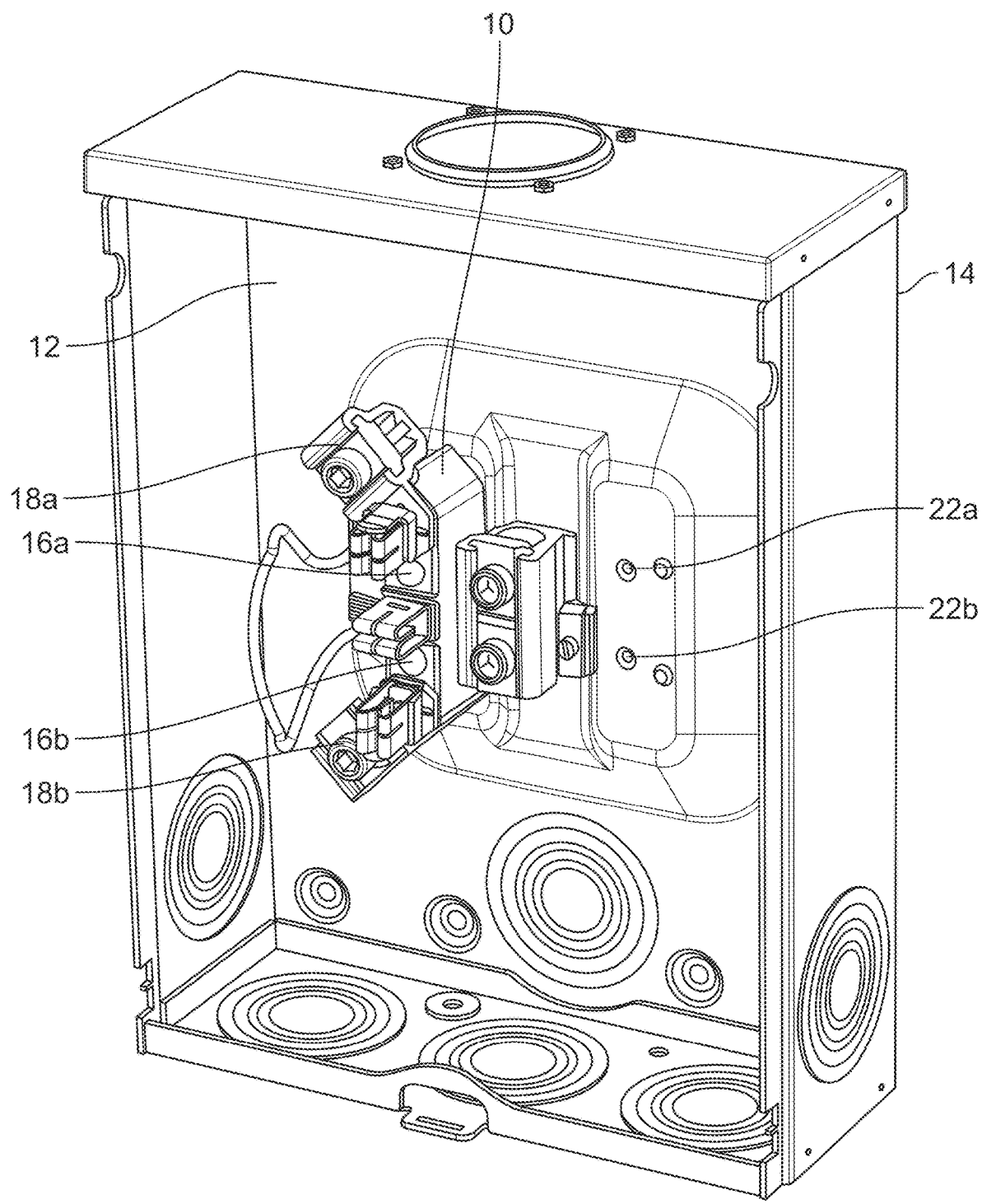
FIG. 1 is a perspective view showing a prior art insulating block coupled to the rear wall of a meter socket enclosure.

The present invention is directed to an insulating block configured for attachment to an electrical structure (e.g., a meter socket enclosure) without the use of a tool, and the combination of the insulating block with the electrical structure, which may be a meter socket enclosure. While the present invention will be described in detail below with reference to various exemplary embodiments, it should be understood that the invention is not limited to the specific configurations of these embodiments. In addition, although the exemplary embodiments are described as embodying several different inventive features, one skilled in the art will appreciate that any one of these features could be implemented without the others in accordance with the present invention.

1. First Exemplary Embodiment of Meter Socket Including an Insulating Block

FIGS. 3-17 show a single-phase power system comprising an electric watt-hour meter 100 installed within a meter socket 200 in accordance with a first exemplary embodiment of meter socket including an insulating block. Meter socket 200 is known as a "ringless" meter socket and has a standardized form to allow the interchangeability of meters from various manufacturers without removing any wires or cables. While meter socket 200 may be employed for meters capable of continuous full load currents of 20 to 400 amperes, it is most typically utilized for residential applications of 200 amperes.

In this exemplary embodiment, meter 100 is an AMI (advanced metering infrastructure) meter that communicates with the electric power utility over an existing communication network, although other types of meters may also be used. The configuration of meter 100 is shown in greater detail in FIG. 3. As can be seen, meter 100 includes a cylindrical cover 102 that is made of glass, transparent plastic (e.g., polycarbonate), or any other suitable material. Cover 102 is secured to a meter base 104 so as to enclose various electronic components within the meter. These electronic components are well known to those skilled in the art. Preferably, a seal (not shown) is used to provide a tight connection between cover 102 and meter base 104 and thereby protect the electronic components from environmental elements. An annular flange 116 extends radially outward from base 104 and includes a front rim 116a (shown in FIG. 5) that provides a mounting connection to a meter socket.

Meter 100 also includes two upper connector blades 106 (only one of which can be seen in FIG. 3) and two lower connector blades 108 (only one of which can be seen in FIG. 3) that extend outward from the back side of meter base 104. As described below, connector blades 106 and 108 are positioned to snap into the upper and lower meter jaws, respectively, of meter jaw block assemblies (such as of the meter jaw block assemblies 250 and 252 shown in FIG. 6, described below). A blade 110 also extends outward from the back side of meter base 104 and, as described below, is positioned to engage an electrical connector used as a neutral reference (not shown). Two upper legs 112 (only one of which can be seen in FIG. 3) and two lower legs 114 (only one of which can be seen in FIG. 3) are also provided that protect blades 106, 108 and 110 when meter 100 is not installed.

Figure 4:
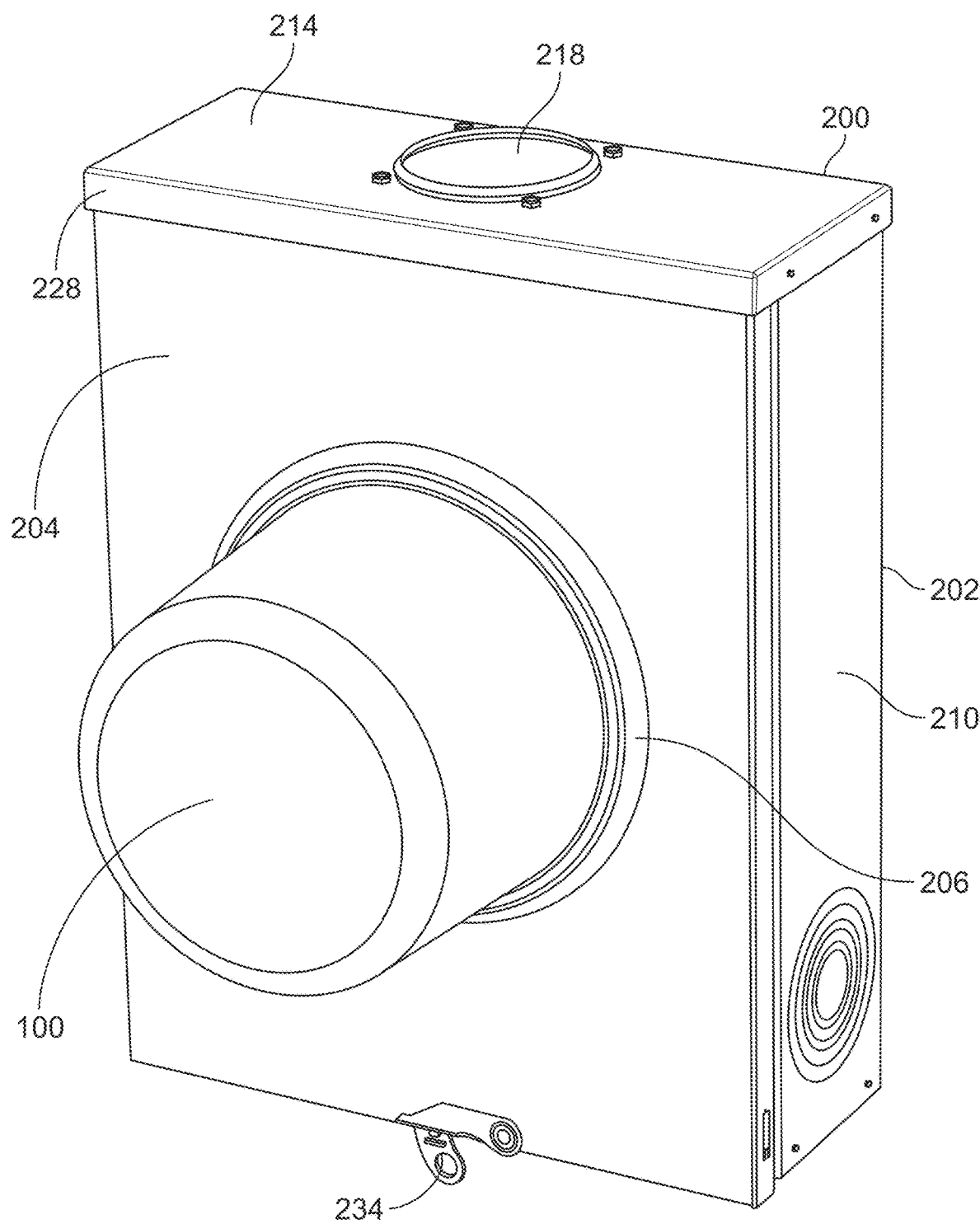
FIG. 4 is a perspective view of the electric watt-hour meter shown in FIG. 3 installed within a ringless meter socket of a single-phase power system in accordance with a first exemplary embodiment of electrical assembly for use with the insulating blocks described herein.
Figure 5:
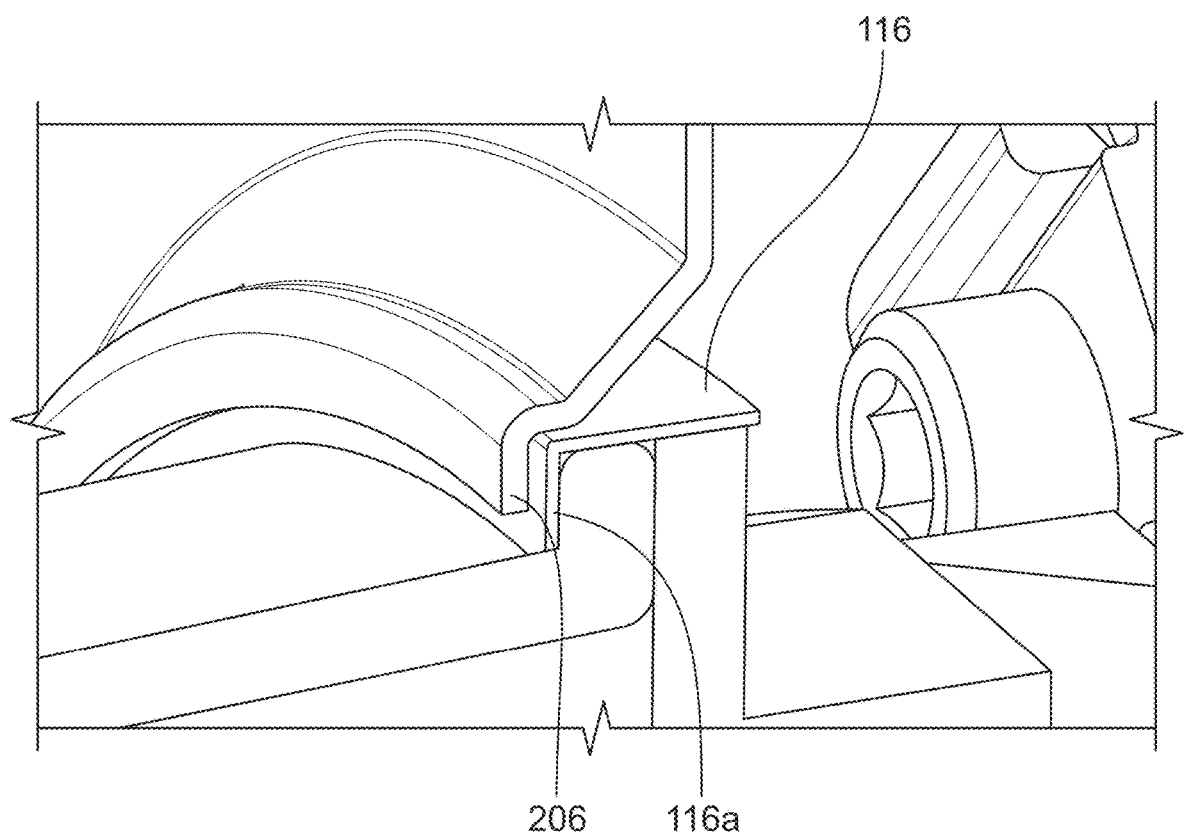
FIG. 5 is an enlarged cross-sectional view of the ringless meter socket and installed meter shown in FIG. 4 showing the cover of the meter socket enclosure retaining the meter in the meter socket.

Referring to FIG. 4, meter socket 200 includes an enclosure 202 having a front wall or cover 204 with a raised embossment 206 surrounding a circular opening through which meter 100 extends. As shown in FIG. 5, raised embossment 206 engages front rim 116a of annular flange 116 on meter 100 (also shown in FIG. 3) when cover 204 is latched to thereby retain meter 100 against the meter supports 268 and 270 (shown in FIG. 6) of meter socket 200, as described below. Thus, it can be appreciated that meter 100 can only be removed from meter socket 200 if cover 204 is removed from meter socket enclosure 202.

Figure 6:
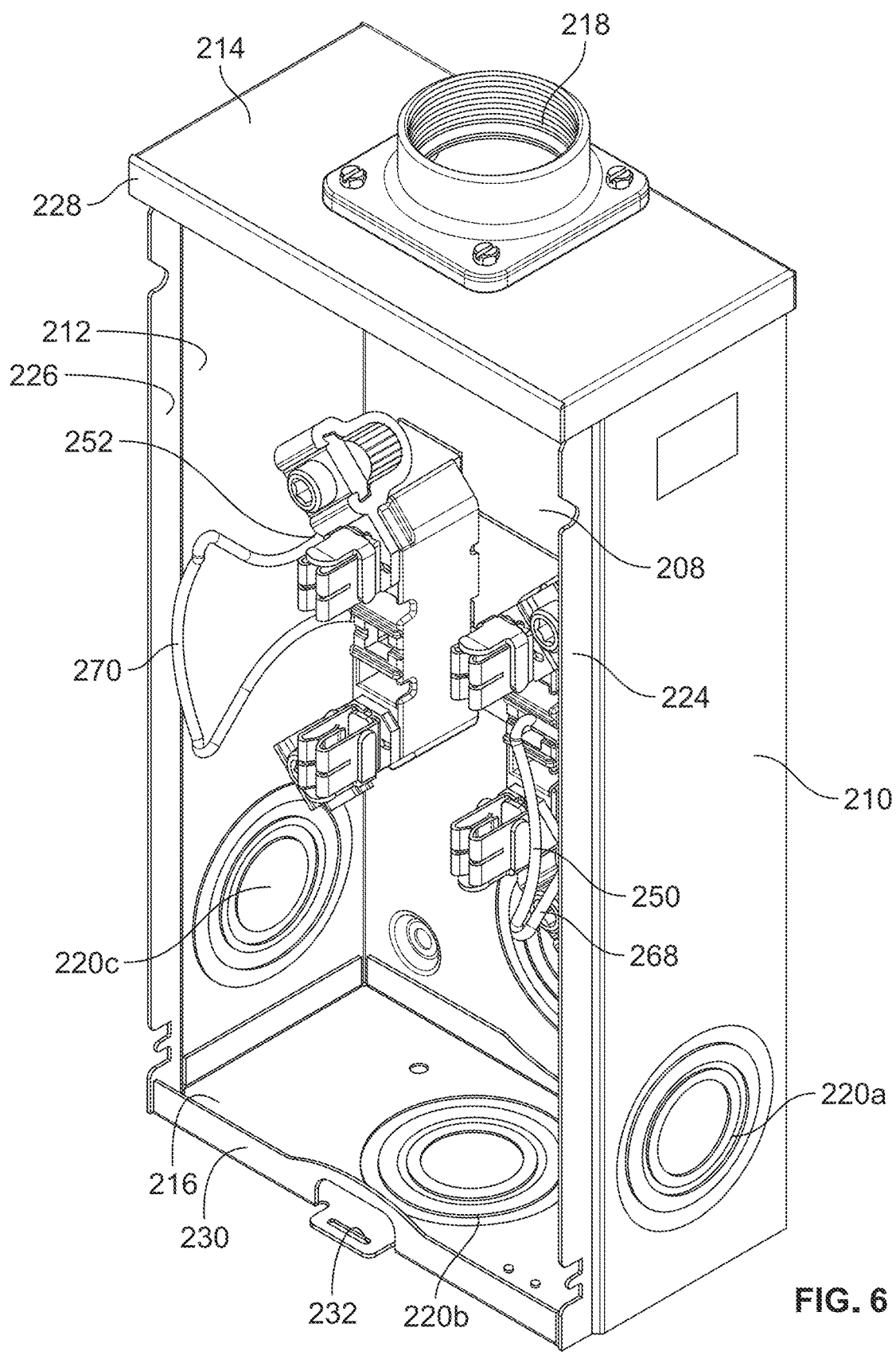
FIG. 6 is a perspective view of the meter socket shown in FIG. 4 with the meter and a front wall removed from the meter socket.
Figure 7:
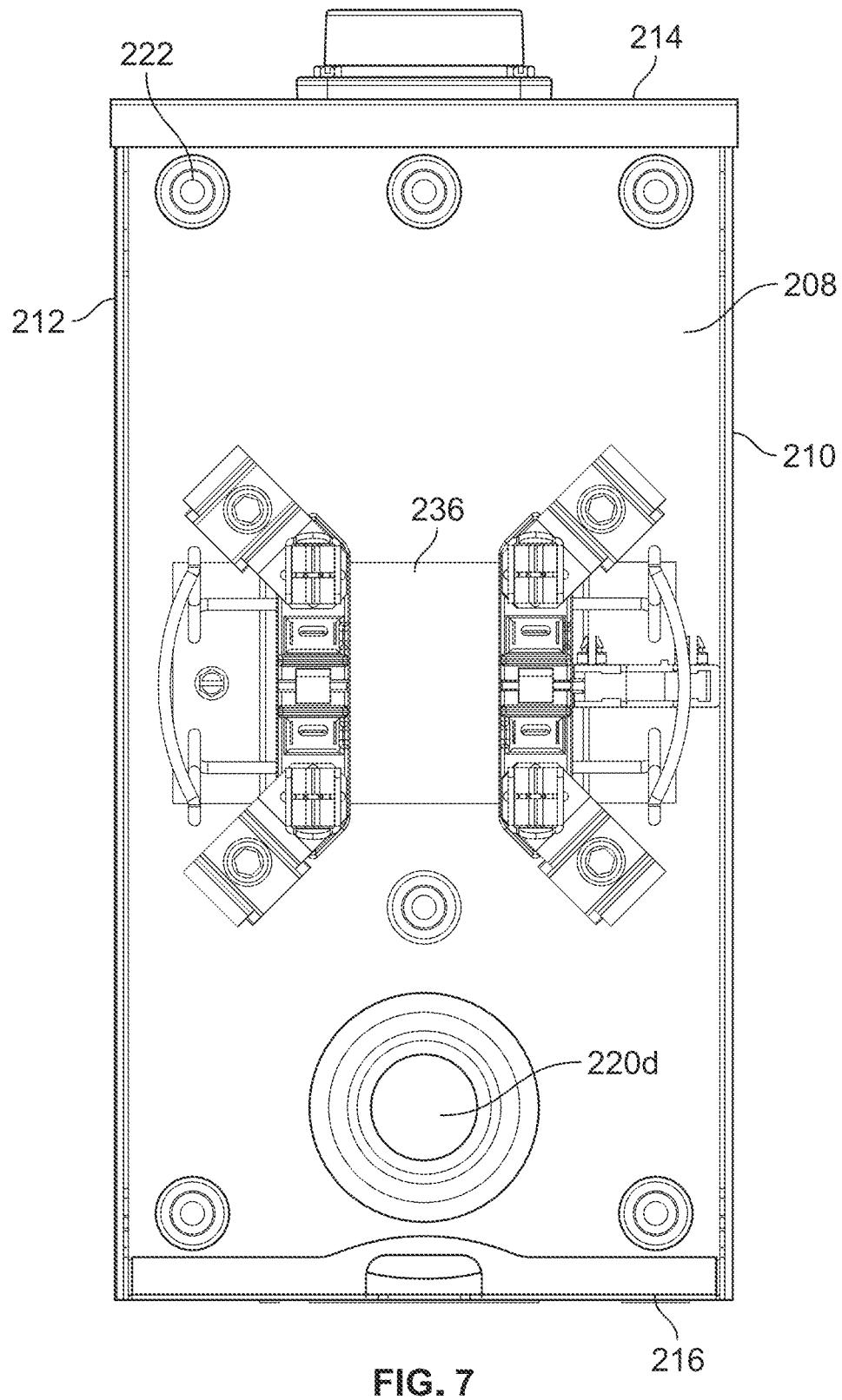
FIG. 7 is a front elevational view of the meter socket shown in FIG. 6.

As shown in FIGS. 6-7, meter socket enclosure 202 also includes a back wall 208, a pair of laterally spaced side walls 210 and 212, a top wall 214, and a bottom wall 216. Side walls 210 and 212 are integral with back wall 208 and are formed by bending side portions of an enclosure blank. Top and bottom walls 214 and 216 are formed as separate members and are secured to back wall 208 and side walls 210 and 212 by any suitable attachment means, such as by spot welding, fasteners, or the like. Of course, top and bottom walls 214 and 216 could alternatively be formed integral with back wall 208.

Top wall 214 is provided with an opening 218 to receive the power supply conductors (not shown) from the electric power utility. As best shown in FIGS. 6 and 7, bottom wall 216 and lower portions of side walls 210 and 212 and back wall 208 are provided with knock-outs 220a-220d, which may be selectively opened to enable the power load conductors (not shown) to exit enclosure 202 for routing to a customer premises. Back wall 208 is provided with preformed holes, one of which is identified as 222, that receive fasteners to secure enclosure 202 to a supporting wall.

To accommodate cover 204, side walls 210 and 212 include inset edges 224 and 226, respectively, while top and bottom walls 214 and 216 include top and bottom flanges 228 and 230, respectively. The upper edge of cover 204 fits under top flange 228 and the inturned side edges of cover 204 overlap inset edges 224 and 226. Bottom flange 230 underlies the bottom edge of cover 204. Bottom flange 230 is provided with a slotted tab 232 that engages a latch 234 rotationally fixed by a rivet to cover 204 (shown in FIG. 4). Electric power utility personnel use a custom tool to secure latch 234 on tab 232 and prevent unauthorized removal of cover 204 (and thus meter 100) from meter socket 200.

Figure 11:
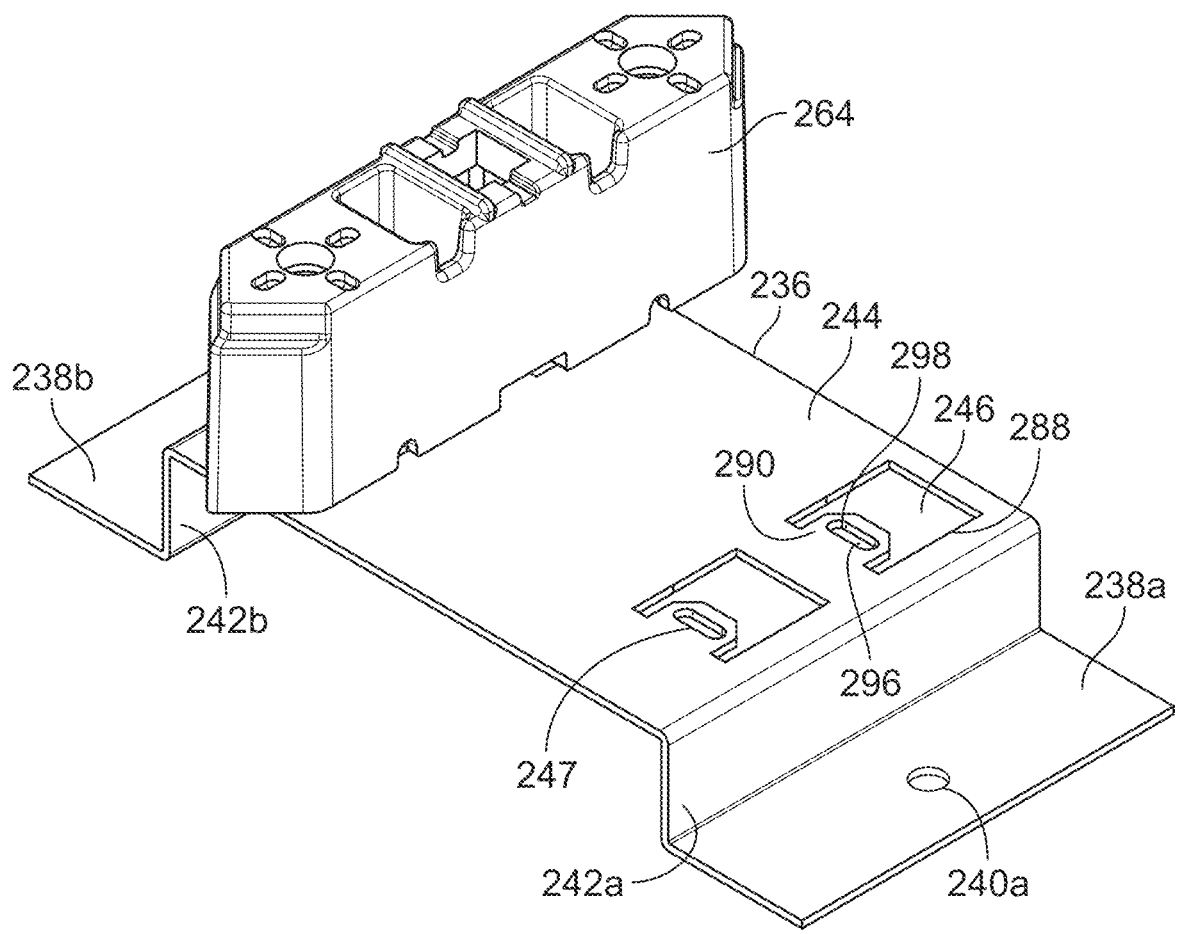
FIG. 11 is a perspective view of the riser structure shown in FIG. 8 with only one insulating block attached to the riser structure.

As shown in FIG. 7, meter socket 200 includes a separate riser structure 236 that is secured to back wall 208. Referring to FIG. 11, riser structure 236 has a pair of mounting walls 238a-b on opposite sides of riser structure 236. Each mounting wall 238a-b includes an opening 240a-b (see FIG. 12), respectively, to receive a fastener to secure the riser structure 236 to the back wall 208. Side walls 242a-b extend forwardly outward from mounting walls 238a-b, respectively, and a planar front wall 244 extends between side walls 242a-b. The side walls 242a-b space the front wall 244 from back wall 208. The spacing of the front wall 244 from back wall 208 is chosen to properly position meter jaw block assemblies 250 and 252 (shown in FIG. 6) in relation to back wall 208. The front wall 244 includes first, second, third, and fourth attachment structures 246, 247, 248, and 249 (see FIG. 12) that are configured to engage the attachment structures of two insulating blocks 258 and 264 (see FIG. 8) as described in more detail below to thereby secure meter jaw block assemblies 250 and 252 to the riser structure 236.

One skilled in the art will appreciate that other types of riser structures may also be used in accordance with the present invention. For example, riser structure 236 may be configured so that front wall 244 is recessed toward back wall 208 between the first attachment structure 246 and the third attachment structure 248. Further, a riser structure could be used that mounts three or more meter jaw block assemblies, such as for use with a three-phase system.

Figure 8:
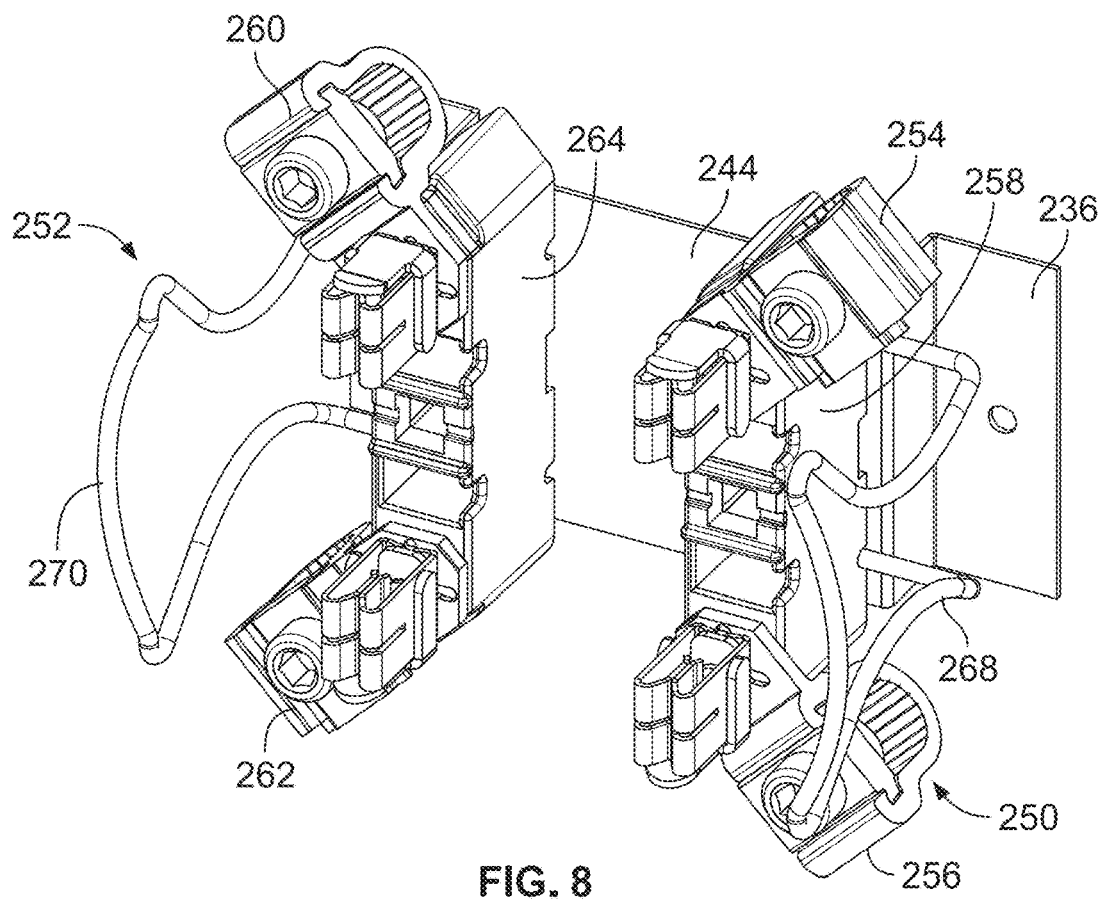
FIG. 8 is a perspective view of a riser structure and meter jaw block assemblies of the meter socket shown in FIG. 4.

Referring to FIG. 8, meter socket 200 includes a first meter jaw block assembly 250 secured to the front wall 244 of riser structure 236 and a second meter jaw block assembly 252 secured to the front wall 244 of riser structure 236.

Meter jaw block assembly 250 includes a top electrical connector 254 and a bottom electrical connector 256 each of which is mounted to an insulating block 258. Similarly, meter jaw block assembly 252 includes a top electrical connector 260 and a bottom electrical connector 262 each of which is mounted to an insulating block 264. It can be appreciated that electric utility power is provided at top electrical connectors 254 and 260 and customer power is provided at bottom electrical connectors 256 and 262. Insulating blocks 258 and 264 function to insulate top electrical connectors 254 and 260 and bottom electrical connectors 256 and 262 from enclosure 202. Optionally, a fifth electrical connector (not shown) may be mounted within an opening in the center of insulating block 264 and used as a neutral reference for certain types of service. Meter jaw block assemblies 250 and 252 also include meter supports 268 and 270 that provide a mounting surface and transient suppression ground terminal for meter 100.

Figure 9:
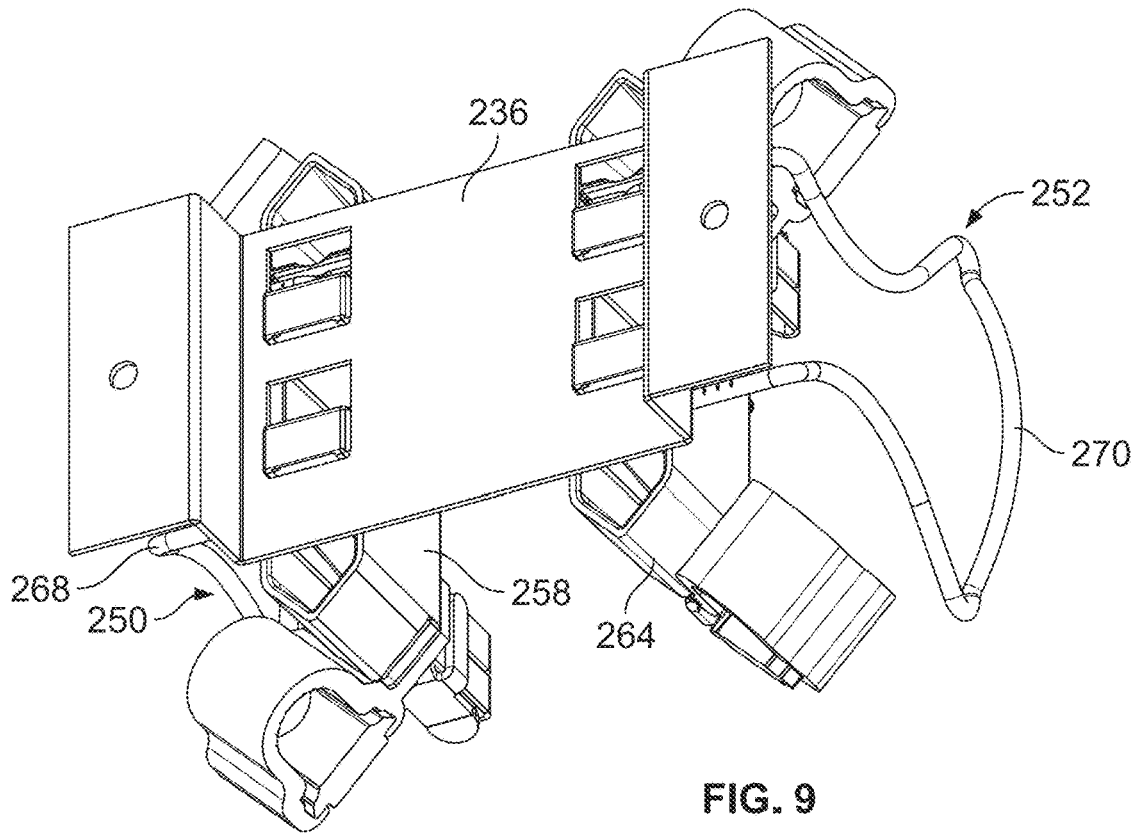
FIG. 9 is a rear perspective view of the riser structure and meter jaw block assemblies shown in FIG. 8.
Figure 10:
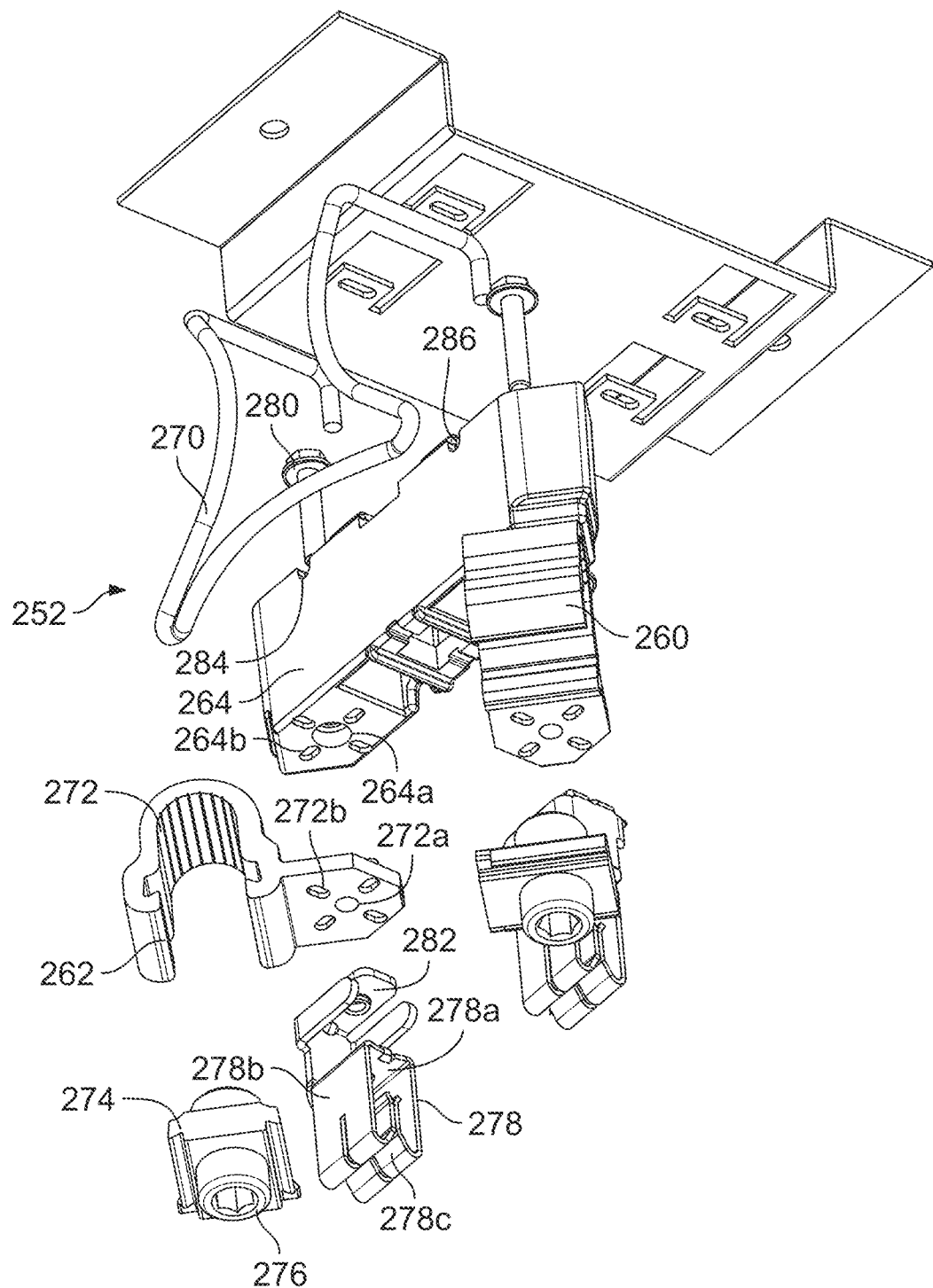
FIG. 10 is an exploded view of the riser structure and one of the meter jaw block assemblies shown in FIG. 8.

Referring to FIGS. 8-10, the configuration of meter jaw block assembly 252 will now be described in greater detail. One skilled in the art will appreciate that the configuration of meter jaw block assembly 250 mirrors that of meter jaw block assembly 252 and will not be separately described herein.

As just described, meter jaw block assembly 252 includes an insulating block 264 with top electrical connector 260 and bottom electrical connector 262 secured thereto. As shown in FIG. 10, insulating block 264 includes two slots 284 and 286 located on its left/back side that are positioned to retain meter support 270 in the appropriate position for mounting meter 100.

Figure 2:
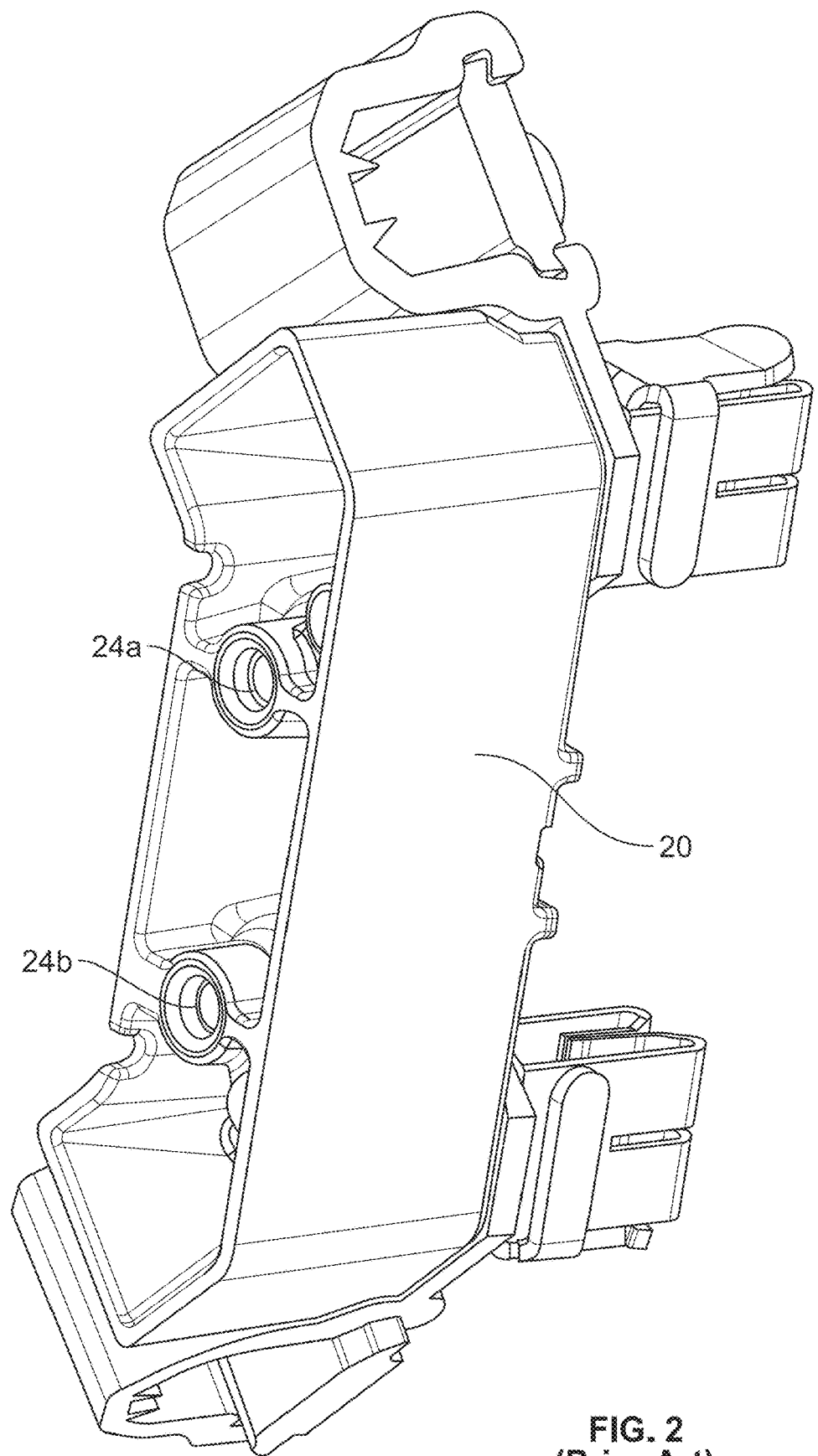
FIG. 2 is a rear perspective view of an insulating block that attaches to the enclosure shown in FIG. 1.
Figure 3:
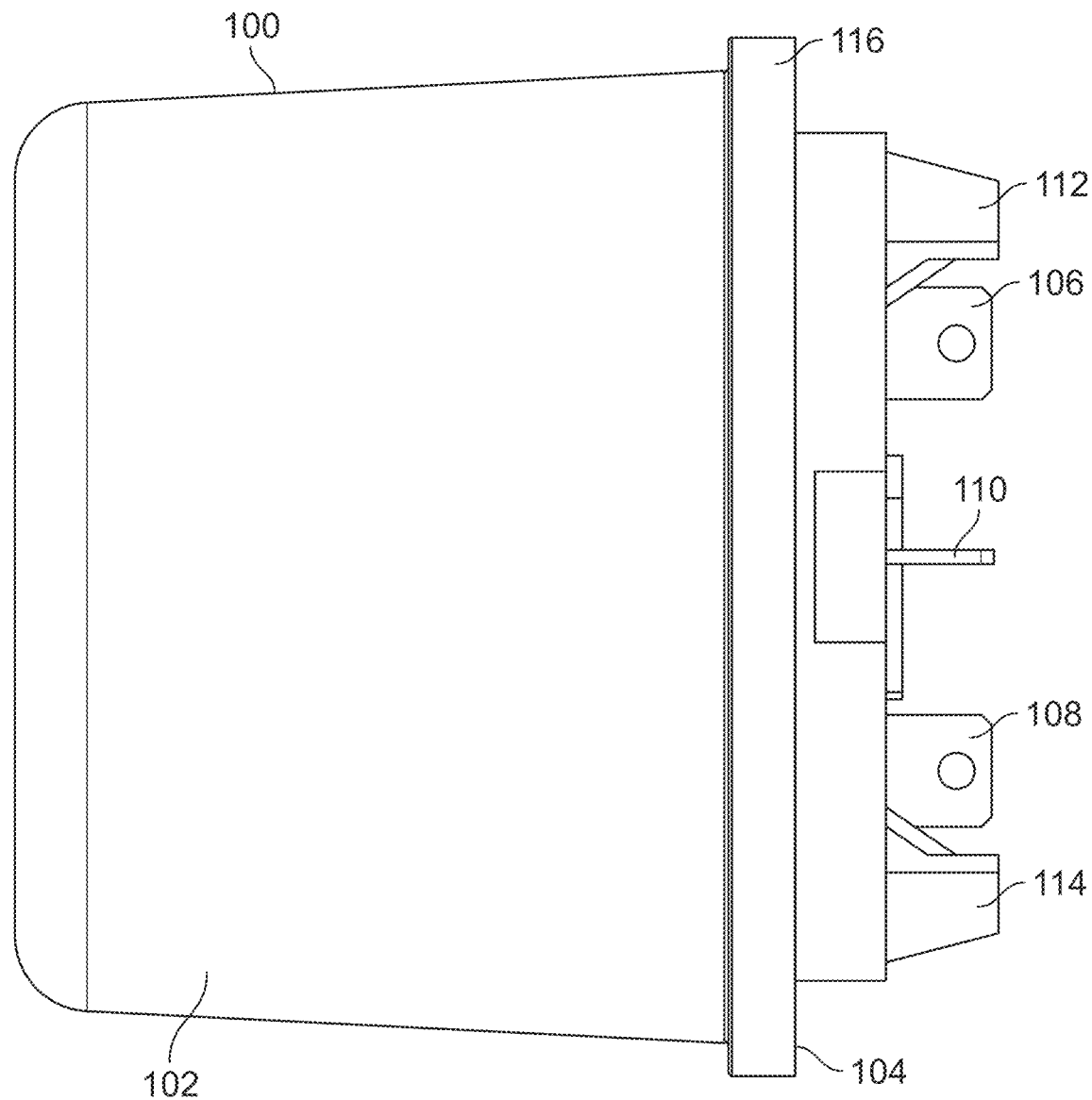
FIG. 3 is a right side elevational view of an electric watt-hour meter.

Referring to FIG. 10, bottom electrical connector 262 includes a conductor receiver having a U-shaped receiver body 272, a slide nut 274, and a threaded slide screw 276. The conductor receiver has an inner surface that defines a channel sized to receive an end portion of one of the power supply conductors. Bottom electrical connector 262 also includes a meter jaw 278 that includes a base 278a with a pair of resilient meter jaw contacts 278b and 278c extending therefrom. Meter jaw contacts 278b and 278c define a space between for receiving the bottom left connector blade (not shown) of meter 100 (FIG. 2). Meter jaw 278 is mechanically, electrically and thermally coupled to receiver body 272 by a bolt 280 and a jaw nut 282. Bolt 280 extends through a hole 264a in insulating block 264 from the back side to the front side and through a hole 272a in receiver body 272 and a hole (not shown) in meter jaw 278 before it is pushed or threaded into jaw nut 282 to secure bottom electrical connector 262 to insulating block 264. Protrusions, one of which is identified as 272b, extending from receiver body 272 are received by recesses, one of which is identified as 264b, formed in insulating block 264 to further align and secure bottom electrical connector 262 to insulating block 264.

Top electrical connector 260 has a structure that is substantially the same as bottom electrical connector 262, and top electrical connector 260 attaches to insulating block 264 in substantially the same manner as bottom electrical connector 262. Accordingly, top electrical connector 260 is not described in detail herein.

Referring to FIGS. 11-17, the structure of insulating block 264 and its connection to riser structure 236 are described in more detail. Insulating block 258 has a substantially similar structure as insulating block 264 and attaches to riser structure 236 in substantially the same manner as insulating block 264. Thus, insulating block 258 is not described in detail herein.

Figure 12:
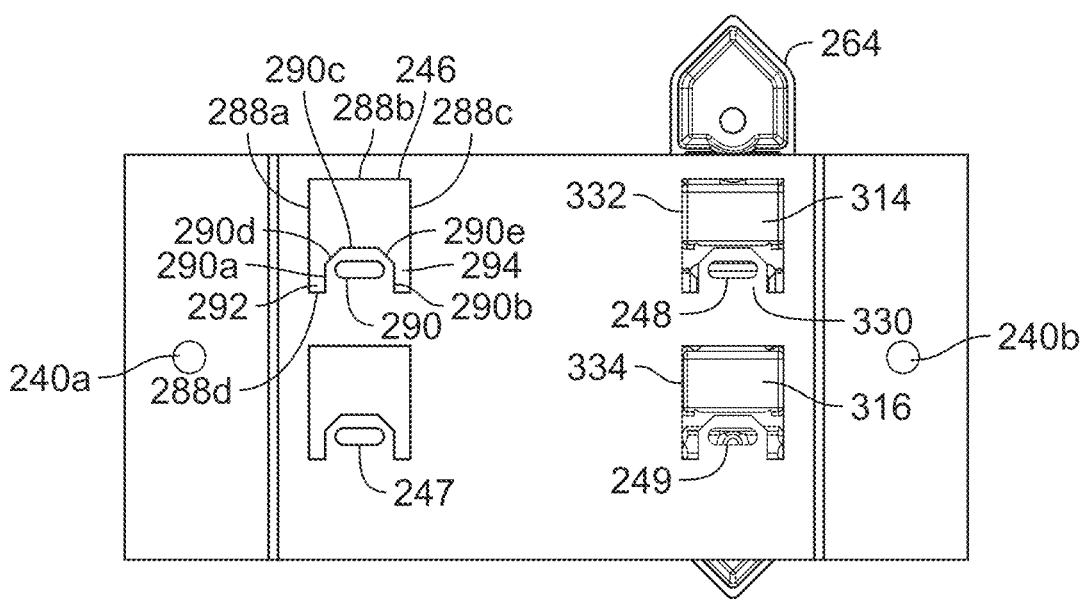
FIG. 12 is a rear elevational view of the riser structure and insulating block shown in FIG. 11 showing the insulating block in a disengaged position.

As described above, riser structure 236 includes first, second, third, and fourth attachment structures 246, 247, 248, and 249 shown in FIG. 12. The first and second attachment structures 246 and 247 are configured to engage insulating block 258 for attaching insulating block 258 to riser structure 236. The third and fourth attachment structures 248 and 249 are configured to engage insulating block 264 for attaching insulating block 264 to riser structure 236. Each of the attachment structures 246, 247, 248, and 249 has a substantially similar structure, and thus only first attachment structure 246 is described in detail herein.

First attachment structure 246 is formed as part of the front wall 244 of riser structure 236. The first attachment structure 246 includes an opening 288 formed in front wall 244. The opening 288 is generally rectangular with four sides 288a-d, shown in FIG. 12. The side 288d of opening 288 is interrupted by a tab 290 that projects into the opening 288. The tab 290 is a portion of front wall 244 that extends upward into the opening 288 from the remainder of front wall 244. The tab 290 is centered on the side 288d of opening 288 such that the opening 288 includes a gap 292 between one side of the tab 290 and the side 288a of opening 288 and a gap 294 between the other side of the tab 290 and the side 288c of opening 288. The tab 290 extends from side 288d toward side 288b less than half the distance between sides 288d and 288b. The tab 290 includes opposite sides 290a-b extending from side 288d of opening 288, a top 290c extending parallel to sides 288b and 288d of opening 288, and chamfered edges 290d-e between top 290c and sides 290a-b, respectively. As shown in FIG. 11, an oval shaped opening 296 extends through approximately a center of the tab 290. A catch surface 298 of the tab 290 extends around the oval shaped opening 296. As described below, the catch surface 298 is configured to engage a clip of one of the insulating blocks 258 or 264 for securely attaching the insulating block 258 or 264 to the riser structure 236 without the use of a tool.

Figure 17:
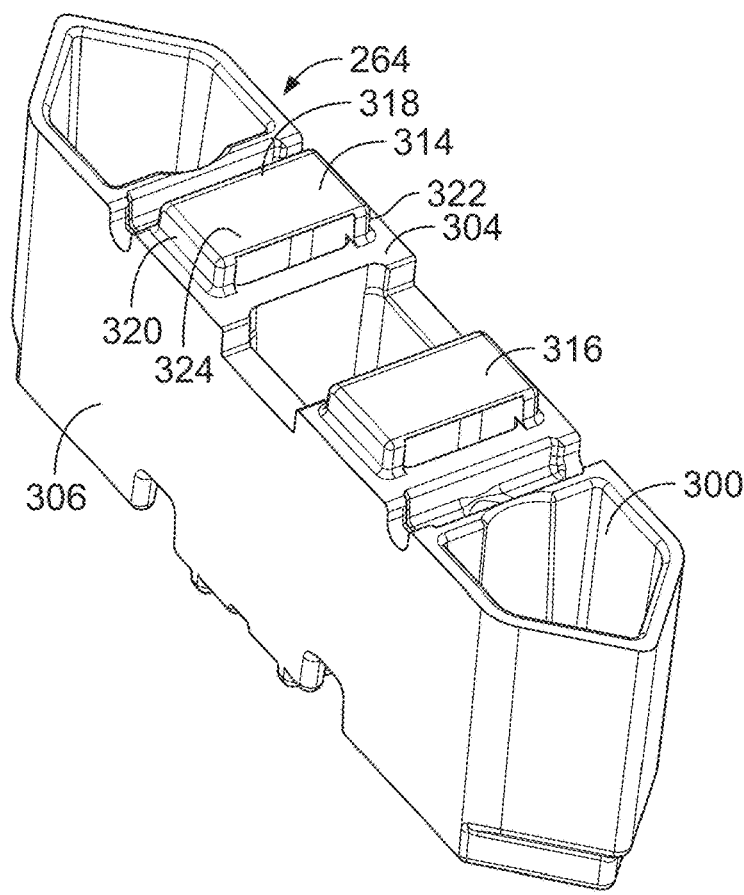
FIG. 17 is a rear perspective view of the insulating block shown in FIG. 15.

Referring now to FIGS. 15-17, insulating block 264 includes a base 300 with a front surface 302 (FIG. 15) and a rear surface 304 (FIG. 17). Side walls 306 and 308 extend between the front surface 302 and the rear surface 304. An upper portion of front surface 302 includes an attachment structure 310 configured for attaching top electrical connector 260 to insulating block 264, and a lower portion of front surface 302 includes an attachment structure 312 configured for attaching bottom electrical connector 262 to insulating block 264. The attachment structure 312 includes the hole 264a described above and the four recesses, one of which is identified as 264b, positioned around hole 264a. Attachment structure 310 has a substantially similar configuration as attachment structure 312.

The insulating block 264 further includes two attachment structures 314 and 316 (FIG. 17) extending outward from the rear surface 304 for mounting the insulating block 264 to riser structure 236 in a tool-free manner. The attachment structures 314 and 316 of insulating block 264 are substantially the same, and thus only attachment structure 314 is described in detail herein. Attachment structure 314 is formed as a protrusion that extends from the rear surface 304. The protrusion includes an upper surface 318, a first side surface 320, and a second side surface 322 that each extend outward from the rear surface 304. A rear wall 324 extends between the upper surface 318, the first side surface 320, and the second side surface 322. As shown in FIG. 16, a clip 326 extends from the rear wall 324 toward the rear surface 304. The clip 326 has an upper surface 326a that extends generally perpendicular from the rear wall 324 and an angled surface 326b that extends from the upper surface 326a to rear wall 324. A gap 328 is positioned between the rear wall 324 and the rear surface 304 below the clip 326. The gap 328 is configured to receive the tab 330 of attachment structure 248 (shown in FIG. 12) as described in more detail below.

Referring to FIGS. 12-14B, the insulating block 264 is securely attached to riser structure 236 as follows. First, the attachment structures 314 and 316 of insulating block 264 are inserted through the openings 332 and 334 of attachment structures 248 and 249, respectively, of riser structure 236. In this position, as shown in FIG. 12, the insulating block 264 is in a disengaged position in which the clip 326 of the attachment structure 314 does not engage the catch surface 336 (FIG. 14B) of the attachment structure 248, and the clip (not shown) of attachment structure 316 does not engage the catch surface (not shown) of the attachment structure 249. The insulating block 264 is then moved downward to an engaged position shown in FIG. 13, in which the clip 326 engages the catch surface 336, as shown in FIG. 14B, and the clip (not shown) of attachment structure 316 engages the catch surface (not shown) of attachment structure 249 to securely attach the insulating block 264 to the riser structure 236. As the clip 326 moves downward to the engaged position shown in FIG. 14B, the gap 328 (FIG. 16) receives the tab 330 of attachment structure 248. Further, the angled surface 326b of the clip 326 engages and slides with respect to an upper portion of the tab 330. The engagement between the angled surface 326b and the tab 330 gradually biases the clip 326 away from the tab 330 and/or the tab 330 away from the clip 326. When the upper surface 326a of the clip 326 is moved downward below the catch surface 336, the clip 326 snaps back toward the tab 330 so that the upper surface 326a of the clip 326 is received within the opening of the tab 330. The upper surface 326a of the clip 326 then engages the catch surface 336 to prevent the insulating block 264 from being moved upward with respect to the riser structure 236. As shown in FIG. 14B, when the insulating block 264 is in the engaged position, downward movement of the insulating block 264 with respect to the riser structure 236 is prevented by engagement of the tab 330 with the underside of the upper surface 318 of the attachment structure 314. Further, as the attachment structure 314 moves downward, the side surfaces 320 and 322 (FIG. 17) of the attachment structure 314 are received within the gaps (not shown but similar to the gaps 292 and 294 shown in FIG. 12) on either side of tab 330. The clip 326 is configured to engage the catch surface 336 without the use of a tool such that an installer of the meter socket 200 may easily attach the insulating block 264 to the riser structure 236 in a secure manner.

When mounted to the riser structure 236, the insulating block 264 has a height extending from the front surface 302 to the rear surface 304 that is sufficient to space the electrical connectors 260 and 262 from the riser structure 236 a desired distance as shown in FIG. 8. The insulating block 264 is formed from a material that is an electrical insulator to electrically insulate the electrical connectors 260 and 262 from the riser structure 236 and meter socket enclosure 202. For example, the insulating block 264 may be formed from a thermosetting polymer or other type of suitable plastic material.

Figure 38B:
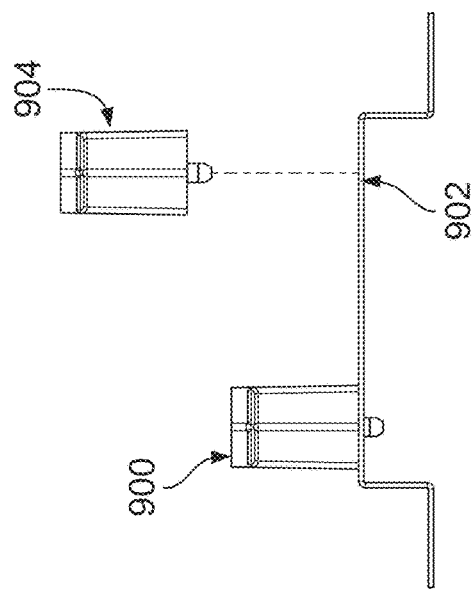
FIGS. 38A-C show a riser structure of an alternative embodiment of meter socket in accordance with the invention described herein showing an insulating block attached to the riser structure.
Figure 38C:
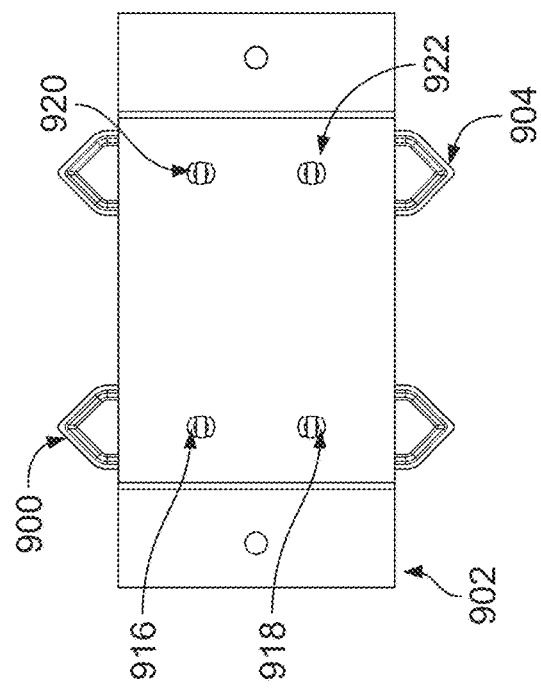
Figure 38A:
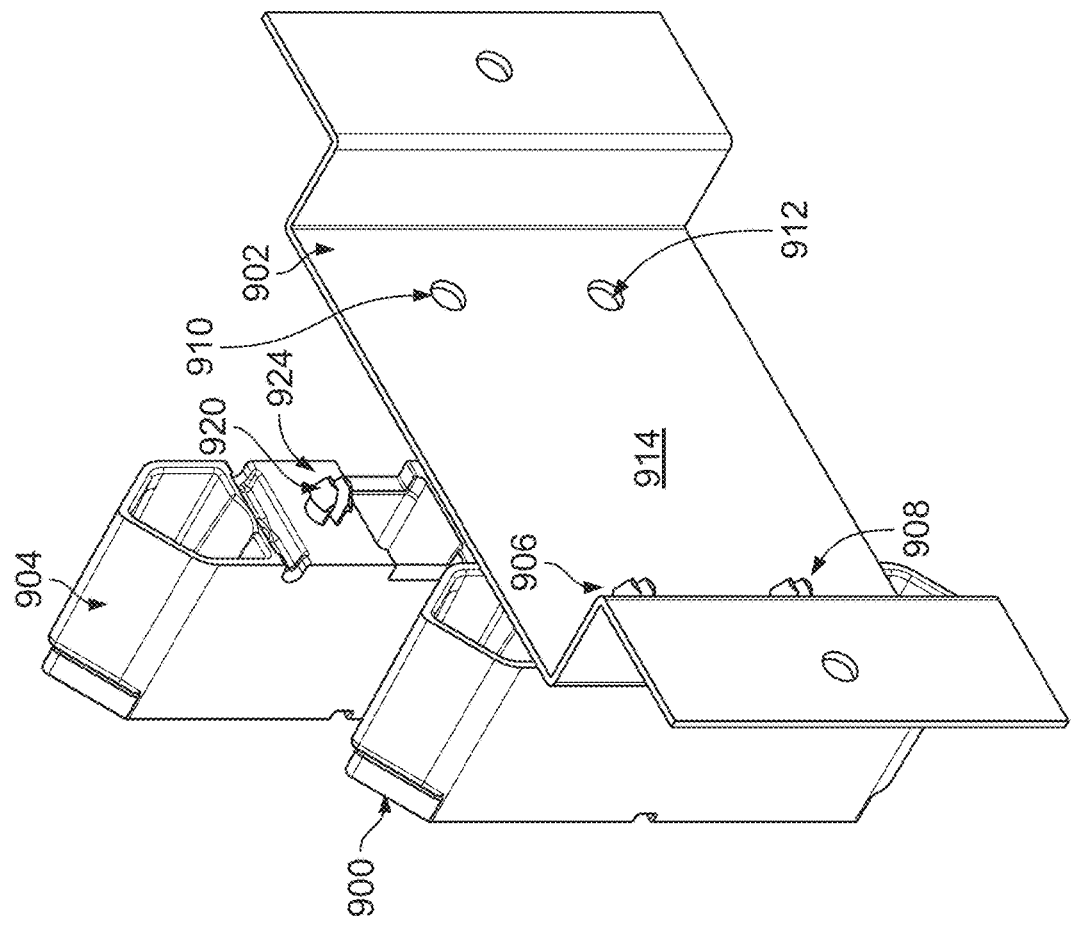

Although in the embodiment described above, the insulating block 264 includes the clip 326 and the riser structure 236 includes the catch surface 336 that engages the clip 326, the clip and catch surface may be reversed so that the insulating block 264 includes the catch surface and the riser structure 236 includes the clip. Further, other types of attachment structures besides a clip and catch surface may be used to attach the insulating block 264 to the riser structure 236 in a tool-free manner. For example, the insulating block 264 or riser structure 236 may have a protruding insert (e.g., a christmas tree clip or an arrow clip) that is configured for reception in a hole or cutout of the other of the insulating block 264 and riser structure 236, for example as shown in FIGS. 38A-C and described below. An annular type snap fit may also be used to attach the insulating block 264 to the riser structure 236. For example, the insulating block 264 or riser structure 236 may have a ball that is configured for reception in a socket of the other of the insulating block 264 and riser structure 236. The insulating block 264 may also be any other type of insulator and may be mounted to other types of electrical components besides a meter socket enclosure. For example, the insulating block 264 may be a circuit breaker bus mount configured for tool-free installation to an electrical enclosure as described above, or any type of insulator mounted to a metal component such as a bridge.

2. Second Exemplary Embodiment of Meter Socket Including an Insulating Block

Figure 18:
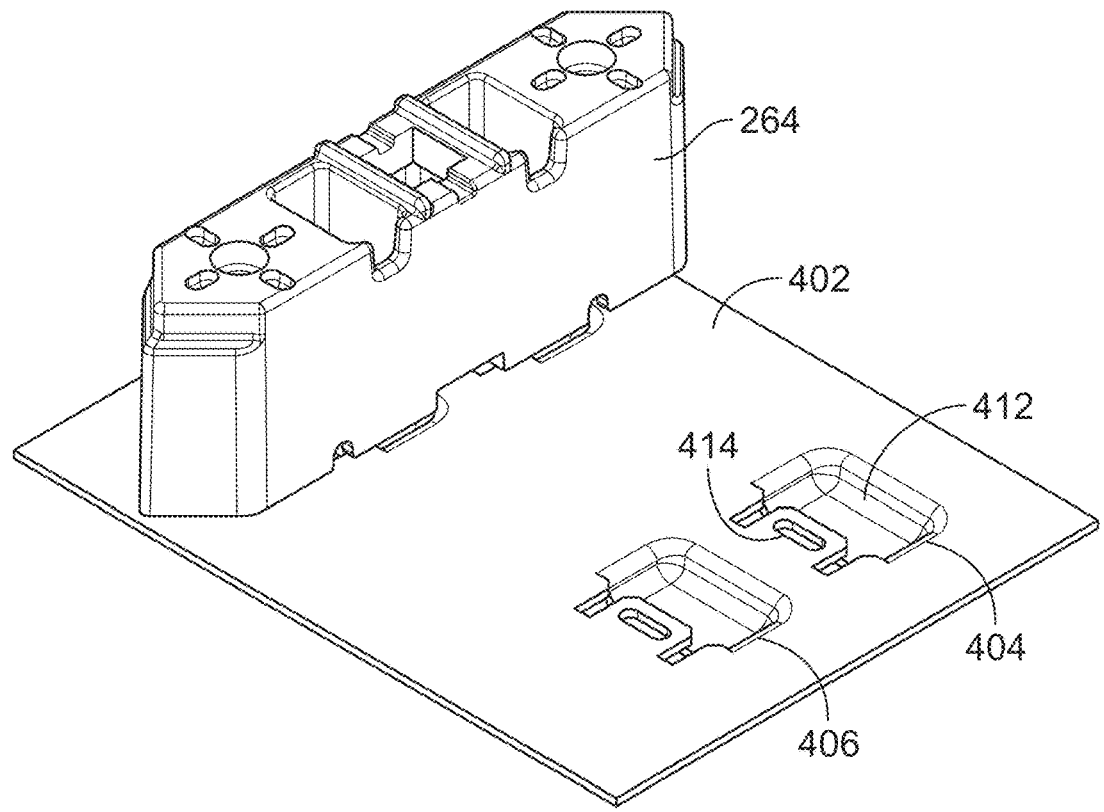
FIG. 18 is a perspective view of a rear wall of an alternative embodiment of meter socket in accordance with the invention described herein showing one insulating block attached to the rear wall.
Figure 19:
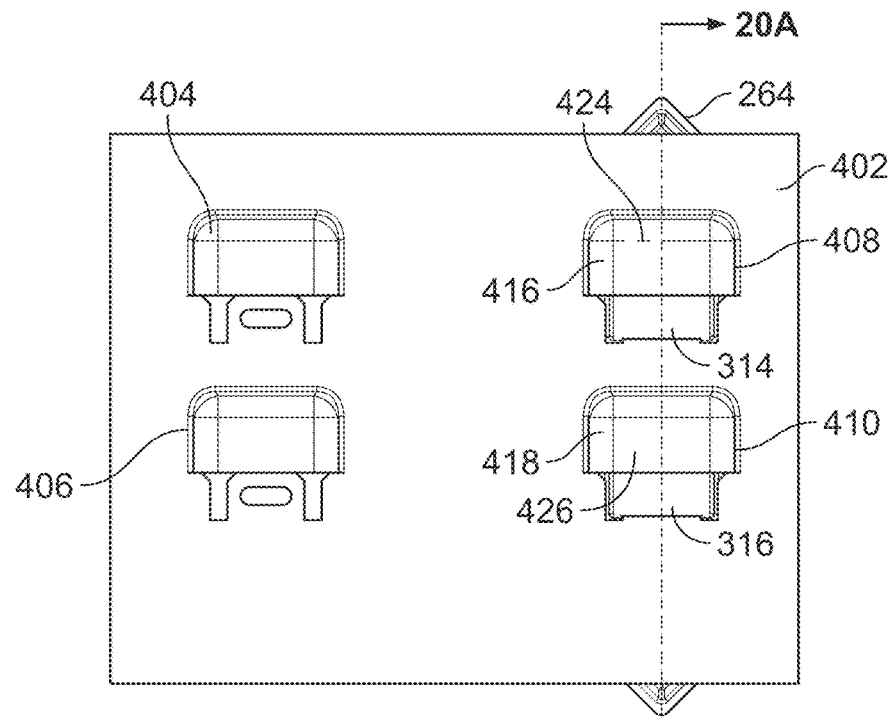
FIG. 19 is a rear elevational view of the rear wall and insulating block shown in FIG. 18.

FIGS. 18-20B show insulating block 264 attached to a back wall 402 of a meter socket enclosure in accordance with another exemplary embodiment of the invention described herein. The back wall 402 may be used in meter socket enclosure 202 shown in FIGS. 6 and 7 in place of the back wall 208. When used in this manner, the riser structure 236 of meter socket enclosure 202 is not needed. FIGS. 18 and 19 only show the portion of the back wall 402 to which the insulating block 264 attaches The remainder of the back wall 402 not shown may have a configuration similar to the back wall 208 shown in FIGS. 6 and 7.

The back wall 402 includes first, second, third, and fourth attachment structures 404, 406, 408, and 410. The attachment structures 404, 406, 408, and 410 are substantially similar. Accordingly, only attachment structure 404 is described in detail herein. Attachment structure 404 includes a recess 412 formed in the back wall 402. The recess 412 is sized to allow the attachment structure 314 (FIG. 17) of insulating block 264 to be received within the recess 412. The recess 412 functions in a similar manner as the opening 288 of attachment structure 246 shown in FIG. 12 and in addition covers at least a portion of the connection between the insulating block 264 and back wall 402 as described in more detail below. The recess 412 may be formed by stamping or pressing a portion of the back wall 402. The recess 412 is positioned above a tab 414 that is substantially similar to the tabs 290 and 330 described above and shown in FIG. 12.

Insulating block 264 is attached to back wall 402 in a substantially similar manner as described above with respect to the attachment of insulating block 264 to riser structure 236. The attachment structures 314 and 316 of insulating block 264 are first inserted into the recesses 416 and 418 (shown in FIG. 19), respectively, of back wall 402. The insulating block 264 is then moved from this disengaged position downward to the engaged position, in which the attachment structures 314 and 316 engage the tabs (one of which is shown as 420 in FIG. 20B) of attachment structures 408 and 410. In this engaged position, the clip 326 of attachment structure 314 engages the catch surface 422 of tab 420. A clip (not shown) of attachment structure 316 engages a tab (not shown) of attachment structure 410 in a similar manner. The insulating block 264 is attachable to the back wall 402 in a tool-free manner.

Figures 20A, 20B:
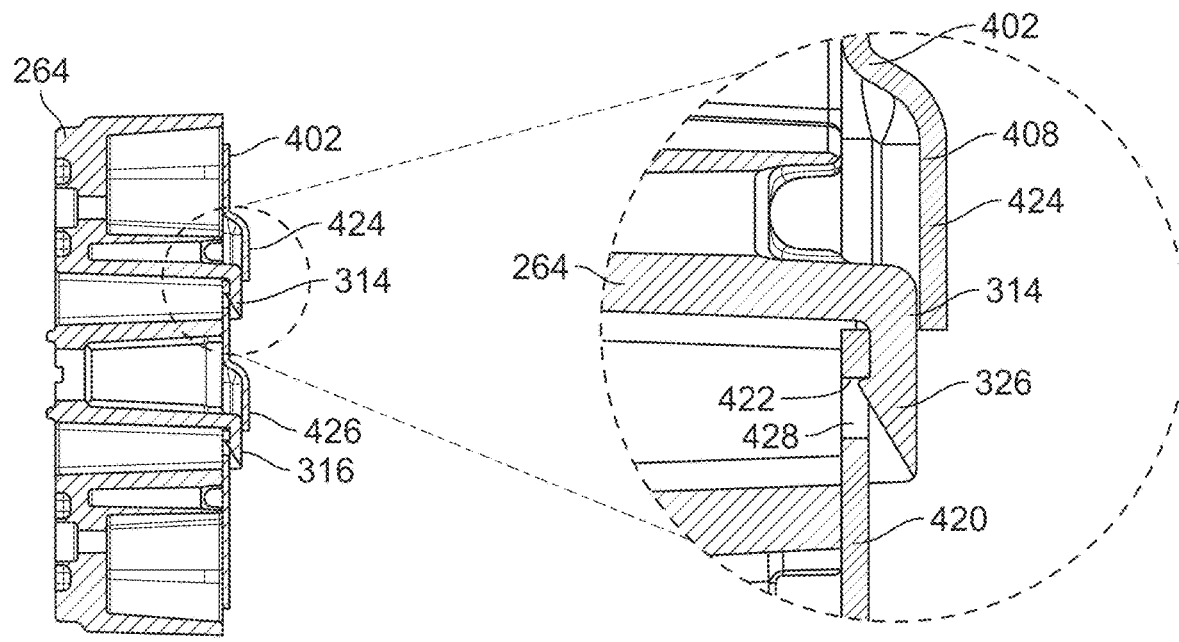
FIG. 20A is a cross-sectional view taken through the line 20A-20A of FIG. 19.
FIG. 20B is a detail view of a portion of FIG. 20A.

As shown in FIGS. 19-20B, when insulating block 264 is in the engaged position, recessed portions 424 and 426 of back wall 402 are positioned above and behind the attachment structures 314 and 316 of insulating block 264 to cover the engagement between the attachment structures 314 and 316 and the back wall 402. This configuration substantially prevents water and contaminants from entering the meter socket enclosure through the openings in back wall 402. For example, if water runs down back wall 402 from the top of back wall 402, the recessed portions 424 and 426 of back wall 402 redirect the water rearward away from the opening 428 (FIG. 20B) through tab 420 and gaps (not shown) on the side of the tab 420. Further, due to this configuration of the back wall 402, a meter socket enclosure including the back wall 402 may be a NEMA 3R rated enclosure.

While back wall 402 is shown as being substantially planar, it is within the scope of this disclosure for back wall 402 to be stamped or formed into other shapes. For example, the back wall 402 may be formed so that that it includes two raised sections, one including attachment structures 404 and 406 and another including attachment structures 408 and 410. Such a configuration may space the insulating blocks attached to the attachment structures 404, 406, 408, and 410 farther away from the remainder of back wall 402.

3. Third Exemplary Embodiment of Meter Socket Including an Insulating Block

Referring now to FIGS. 21-24, an insulating block 500 is shown attached to a riser structure 502 of a meter socket enclosure in accordance with another exemplary embodiment of the invention described herein. Two of the insulating blocks 500 and the riser structure 502 may be used with meter socket enclosure 202 in place of the insulating blocks 258 and 264 and riser structure 236. Further, the insulating block 500 and riser structure 502 may be used with other types of electrical assemblies other than a meter socket enclosure.

Figure 23:
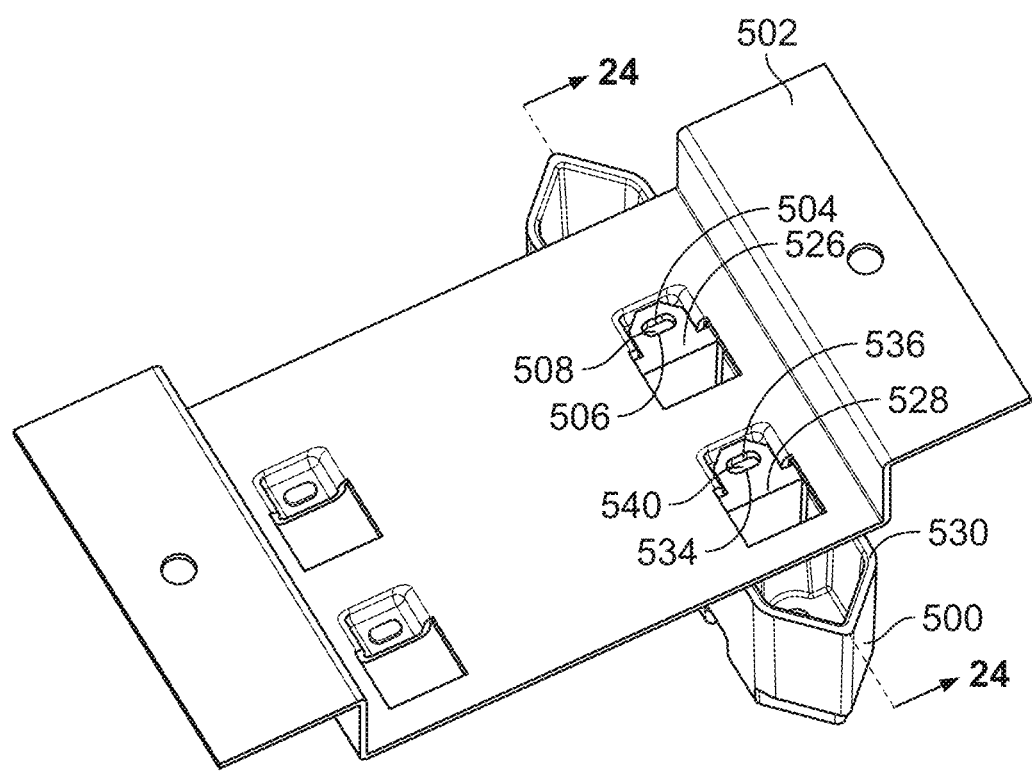
FIG. 23 is a rear perspective view of the riser structure and insulating block shown in FIG. 21 showing the insulating block attached to the riser structure.
Figure 24:
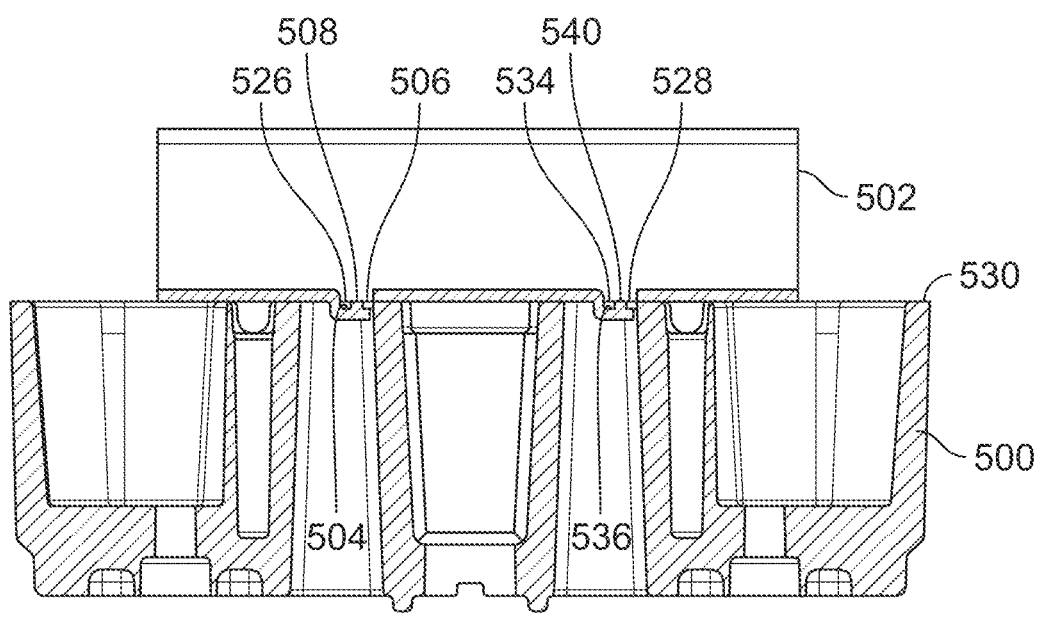
FIG. 24 is a cross-sectional view taken through the line 24-24 in FIG. 23.

Insulating block 500 and riser structure 502 are similar to the insulating block 264 and riser structure 236 described above except that the insulating block 500 includes a catch surface 504 surrounding an opening 506 and the riser structure 502 includes a clip 508 configured to engage the catch surface 504, as shown in FIGS. 23-24.

Figure 21:
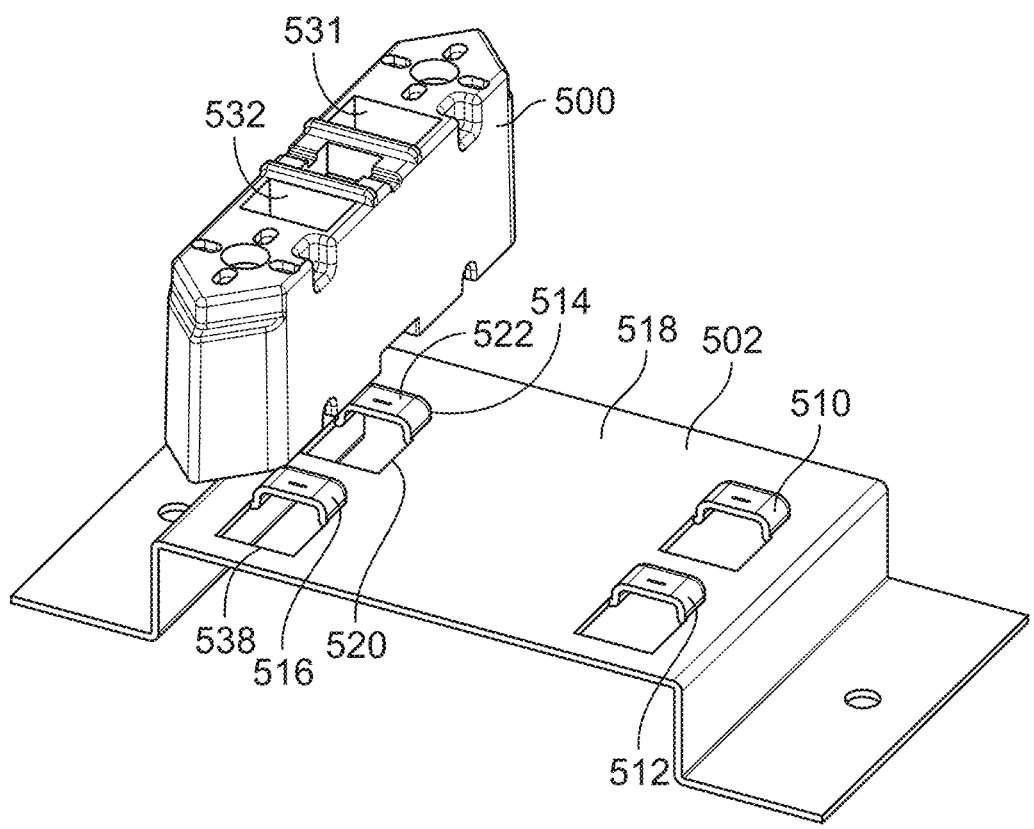
FIG. 21 is a perspective view of a riser structure of an alternative embodiment of meter socket in accordance with the invention described herein showing one insulating block prior to its attachment to the riser structure.
Figure 22:
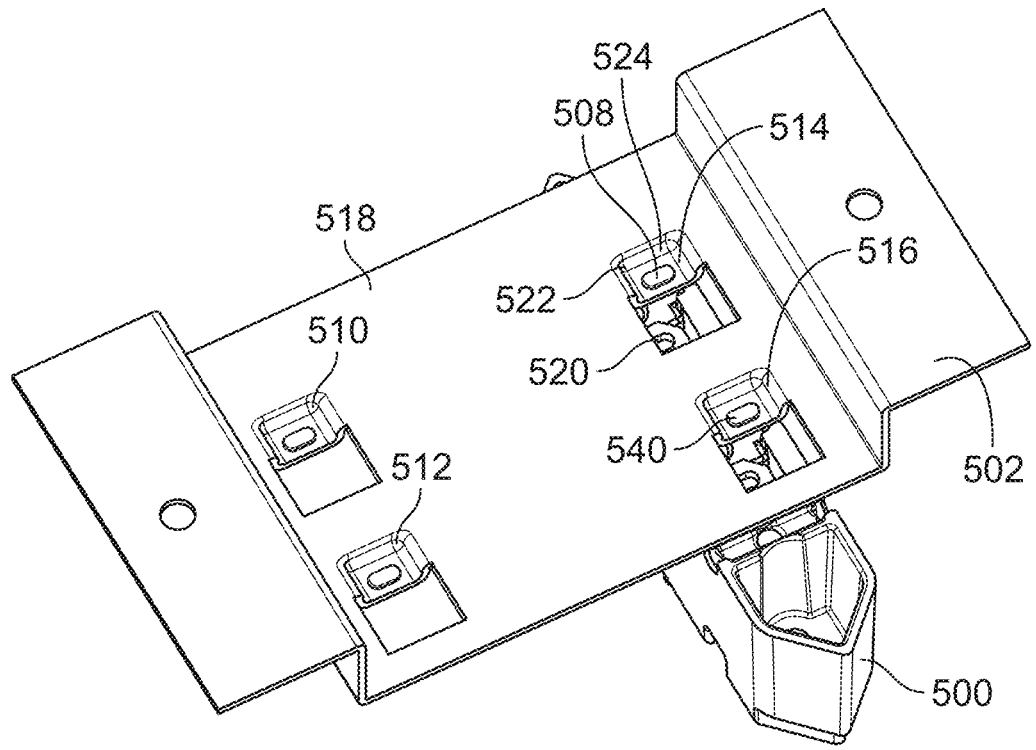
FIG. 22 is a rear perspective view of the riser structure and insulating block shown in FIG. 21.

As shown in FIGS. 21-22, the riser structure 502 includes four attachment structures 510, 512, 514, and 516 in similar positions on the riser structure 502 as the attachment structures 246, 247, 248, and 249 of riser structure 236 shown in FIG. 12. Besides the specific configuration of the attachment structures 510, 512, 514, and 516, the configuration of riser structure 502 is substantially the same as riser structure 236 shown in FIG. 11. Insulating block 500 attaches to attachment structures 514 and 516, as shown in FIGS. 23-24, and another insulating block (not shown) like insulating block 500 attaches to attachment structures 510 and 512.

Attachment structures 510, 512, 514, and 516 are substantially similar, and thus only attachment structure 514 is described in detail herein. Attachment structure 514 is formed as part of the front wall 518 of riser structure 502. The attachment structure 514 includes an opening 520. A protrusion 522 of the front wall 518 is positioned directly above the opening 520. The protrusion 522 may be formed by stamping or pressing a portion of the front wall 518. As shown in FIG. 22, the protrusion 522 forms a recess 524 in a rear surface of the front wall 518. The clip 508 extends from a rear surface of the protrusion 522 into the recess 524. The clip 508 is in the form of an oval-shaped protrusion extending outward from the rear surface of the protrusion 522. It is within the scope of this disclosure for the clip 508 to have other shapes other than an oval-shaped protrusion.

Referring to FIGS. 23 and 24, insulating block 500 includes two attachment structures 526 and 528 on its rear surface 530. The attachment structures 526 and 528 are tabs with a substantially similar shape as the tabs 290 and 330 shown in FIG. 12 and described above. The attachment structures 526 and 528 protrude from the remainder of rear surface 530 and are positioned behind the cavities 531 and 532, respectively, shown in FIG. 21. Opening 506 extends through attachment structure 526 with catch surface 504 surrounding opening 506. Attachment structure 528 has a similar opening 534 and catch surface 536.

Insulating block 500 is attached to riser structure 502 by first inserting the attachment structures 526 and 528 of insulating block 500 into the openings 520 and 538 (FIG. 21) of front wall 518. The insulating block 500 is then moved from this disengaged position upward to the engaged position, in which the attachment structures 526 and 528 engage the clips 508 and 540 of attachment structures 514 and 516. In this engaged position shown in FIG. 23, the clip 508 of attachment structure 514 extends through the opening 506 and engages the catch surface 504 to prevent movement of the insulating block 500 with respect to the riser structure 502. The clip 540 of attachment structure 516 engages the attachment structure 528 of insulating block 500 in a similar manner. The insulating block 500 is attachable to the riser structure 502 in a tool-free manner.

In another configuration, the attachment structures 510, 512, 514, and 516 of riser structure 502 may be used with the back wall 402 in place of the attachment structures 404, 406, 408, and 410 shown in FIGS. 18-20B, and the attachment structures 526 and 528 of insulating block 500 may be used on insulating block 264 in place of the attachment structures 314 and 316 shown in FIG. 17.

4. Electrical Assembly Including an Insulating Block Configured for Use with an Isolated Neutral Conductor FIGS. 25-27 show an electrical assembly 600 in accordance with another exemplary embodiment of the invention described herein. The electrical assembly 600 includes a bridge or riser structure 602 and an insulating block 604 that is configured for attachment to the bridge 602 in a tool-free manner. The insulating block 604 is formed from a material that is an electrical insulator like the insulating block 264 described above. The insulating block 604 may be used as a standoff for an isolated neutral conductor.

The bridge 602 has a wall 606 to which the insulating block 604 attaches. The wall 606 includes a pair of attachment structures 608 and 610 (FIG. 27) that are spaced apart from each other. Each of the attachment structures 608 and 610 are substantially similar, and thus only attachment structure 608 is described in detail herein with reference to FIG. 25. The attachment structure 608 includes two openings 612 and 614 formed in the wall 606. The opening 612 is positioned above the opening 614 and is larger than the opening 614 for reasons described below. A catch surface 616 surrounds the opening 614.

The insulating block 604 has a front surface 618 and a rear surface 620. The insulating block 604 is configured for attachment to an electrical connector adjacent the front surface 618. The rear surface 620 is positioned adjacent the wall 606 when the insulating block 604 is attached to the wall 606. The insulating block 604 includes two attachment structures 622 and 624 (FIG. 27), which extend rearward from the rear surface 620. The attachment structures 622 and 624 are configured to engage the attachment structures 608 and 610, respectively, of the wall 606. The attachment structures 622 and 624 are substantially similar, and thus only attachment structure 622 is described in detail herein.

Attachment structure 622 includes a first section 622a that extends outward from the rear surface 620 in a direction that is generally perpendicular to the rear surface 620. A second section 622b extends downward from the first section 622a in a direction that is generally parallel to the rear surface 620. A lower portion of the second section 622b has an angled surface 622c facing the rear surface 620. The second section 622b includes a clip 626 that extends toward the rear surface 620 with the angled surface 622c forming a front surface of the clip 626. The clip 626 has an upper surface 628 that is spaced apart from the rear surface 620 and generally perpendicular to the rear surface 620.

The attachment structure 622 and opening 612 are sized and configured so that the attachment structure 622 is insertable through the opening 612. The first section 622a extends rearward from rear surface 620 a sufficient distance to allow the second section 622b to be positioned rearward of the wall 606 when the attachment structure 622 is positioned in the opening 612.

To attach the insulating block 604 to the wall 606, the attachment structures 622 and 624 of the insulating block 604 are first placed within the openings 612 and 630 (FIG. 27) of the wall 606. The insulating block 604 is then moved downward with respect to the wall 606 to the engaged position shown in FIGS. 26 and 27. In the engaged position, the clip 626 partially extends through the opening 614 from the rear of the wall 606. The clip 626 engages the catch surface 616, and the clip (not shown) of attachment structure 624 engages the catch surface (not shown) of attachment structure 610 to securely attach the insulating block 602 to the wall 606. As the clip 626 moves downward to the engaged position shown in FIGS. 26-27 the angled surface 622c engages and slides with respect to the portion of wall 606 between openings 612 and 614. The engagement between the angled surface 622c and the wall 606 gradually biases the clip 626 away from the wall 606. When the upper surface 628 of the clip 626 is moved downward below the catch surface 616, the clip 626 snaps back toward the wall 606 so that the upper surface 628 of the clip 626 is received within the opening 614. The upper surface 628 of the clip 626 then engages the catch surface 616 to prevent the insulating block 604 from being moved upward with respect to the wall 606. Downward movement of the insulating block 604 is prevented by the first section 622a of the attachment structure 622 engaging the portion of wall 606 between the openings 612 and 614. The clip 626 is configured to engage the catch surface 616 without the use of a tool such that an installer may easily attach the insulating block 604 to the wall 606 in a secure manner.

The specific configuration of the attachment structures 608, 610, 622 and 624 may be used with the meter socket 200, back wall 402, insulating block 500, and riser structure 502 described above in lieu of the attachment structures described above for the meter socket 200, back wall 402, insulating block 500, and riser structure 502.

Figure 28:
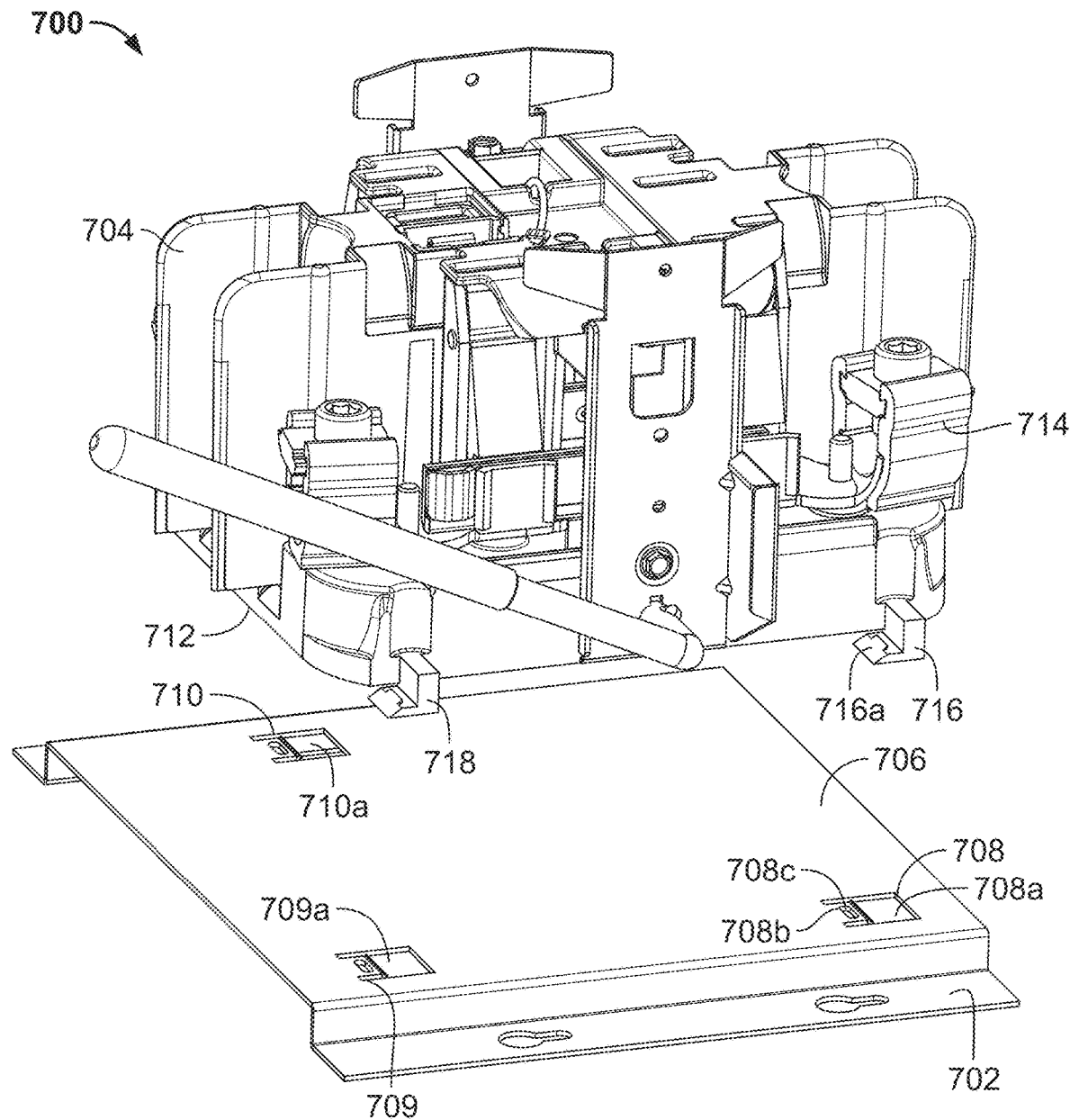
FIG. 28 is a perspective view of an electrical assembly in accordance with another alternative embodiment of the invention showing an insulating block for use with a lever bypass meter socket prior to its attachment to a bridge.
Figure 29:
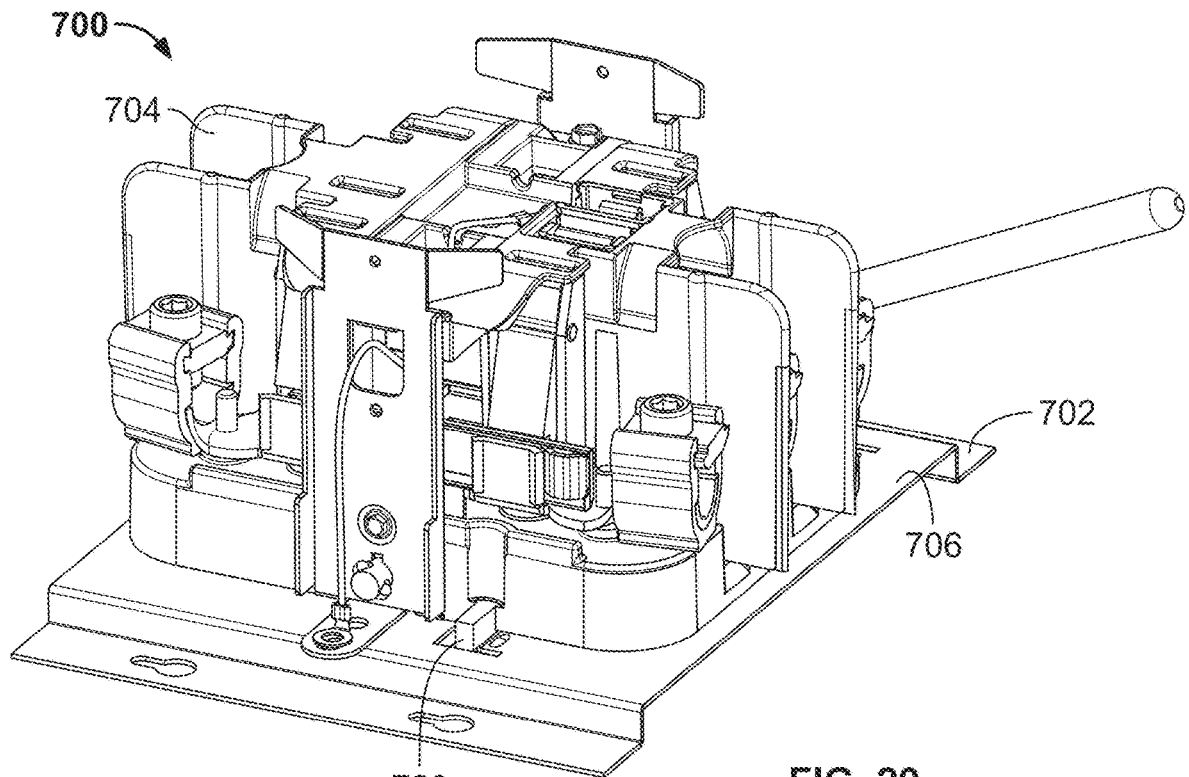
FIG. 29 is a perspective view of the electrical assembly shown in FIG. 28 showing the insulating block attached to the bridge.
Figure 30:
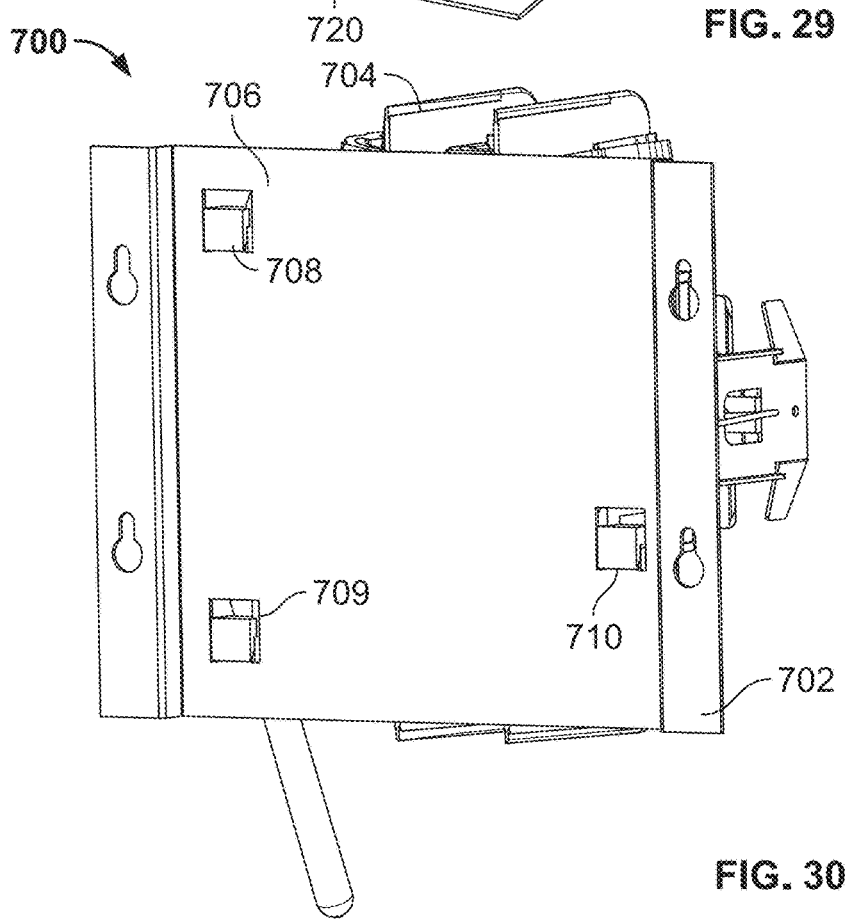
FIG. 30 is a rear perspective view of the electrical assembly shown in FIG. 29.

5. Electrical Assembly Including an Insulating Block Configured for Use with a Lever Bypass Meter Socket FIGS. 28-30 show an electrical assembly 700 in accordance with another exemplary embodiment of the invention described herein. The electrical assembly 700 includes a bridge or riser structure 702 and an insulating block 704 that is configured for attachment to the bridge 702 in a tool-free manner. The insulating block 704 is formed from a material that is an electrical insulator like the insulating block 264 described above. The insulating block 704 may be used with a lever bypass meter socket.

The bridge 702 has a wall 706 to which the insulating block 704 attaches. The wall 706 includes three attachment structures 708, 709, and 710 (FIGS. 28 and 30) that are spaced apart from each other. Each of the attachment structures 708, 709, and 710 are substantially similar to the attachment structure 246 described above and shown in FIG. 11. Thus, the attachment structures 708, 709, and 710 are not described in detail herein.

The insulating block 704 has a rear surface 712 that is positioned adjacent the wall 706 when the insulating block 704 is attached to the wall 706. Electrical connectors, one of which is identified as 714 in FIG. 28, are attached to insulating block 704 and spaced apart from the rear surface 712 outward from the wall 706. The insulating block 704 includes three attachment structures 716, 718, and 720 (FIG. 29), which extend rearward from the rear surface 712. The attachment structures 716, 718, and 720 are configured to engage the attachment structures 708, 709, and 710, respectively, of the wall 706. The attachment structures 716, 718, and 720 are substantially similar to the attachment structure 622 shown in FIG. 25 and described above. Thus, the attachment structures 716, 718, and 720 are not described in detail herein.

To attach the insulating block 704 to the wall 706, the attachment structures 716, 718, and 720 of the insulating block 704 are first placed within the openings 708a, 709a, and 710a of the attachment structures 708, 709, and 710, respectively. The insulating block 704 is then moved downward with respect to the wall 706 to the engaged position shown in FIGS. 29 and 30. In the engaged position, the clips on the attachment structures 716, 718, and 720 partially extend through the openings of the attachment structures 708, 709, and 710 from the rear of the wall 706. For example, the clip 716a of attachment structure 716 extends through the opening 708b of attachment structure 708. The clip 716a engages the catch surface 708c surrounding the opening 708b, and the clips (not shown) of attachment structures 718 and 720 engage the catch surfaces (not shown) of attachment structures 709 and 710 to securely attach the insulating block 704 to the wall 706. As the clip 716a moves downward to the engaged position shown in FIGS. 29-30 the angled surface of the clip 716a engages and slides with respect to the portion of wall 706 between openings 708a-b in a similar manner as described above with respect to the clip 626. The engagement between the angled surface of the clip 716a and the wall 706 gradually biases the clip 716a away from the wall 706. When the upper surface of the clip 716a is moved downward below the catch surface 708c, the clip 716a snaps back toward the wall 706 so that the upper surface of the clip 716a is received within the opening 708b. The upper surface of the clip 716a then engages the catch surface 708c to prevent the insulating block 704 from being moved upward with respect to the wall 706. Downward movement of the insulating block 704 is prevented by the attachment structure 716 engaging the portion of wall 706 between the openings 708a and 708b in a similar manner as described above for attachment structure 622. The clip 716a is configured to engage the catch surface 708c without the use of a tool such that an installer may easily attach the insulating block 704 to the wall 706 in a secure manner.

The specific configuration of the attachment structures 708, 709, 710, 716, 718, and 720 may be used with the meter socket 200, back wall 402, insulating block 500, riser structure 502, and electrical assembly 600 described above in lieu of the attachment structures described above for the meter socket 200, back wall 402, insulating block 500, riser structure 502, and electrical assembly 600.

6. Bubble Level for Meter Socket

Figure 31:
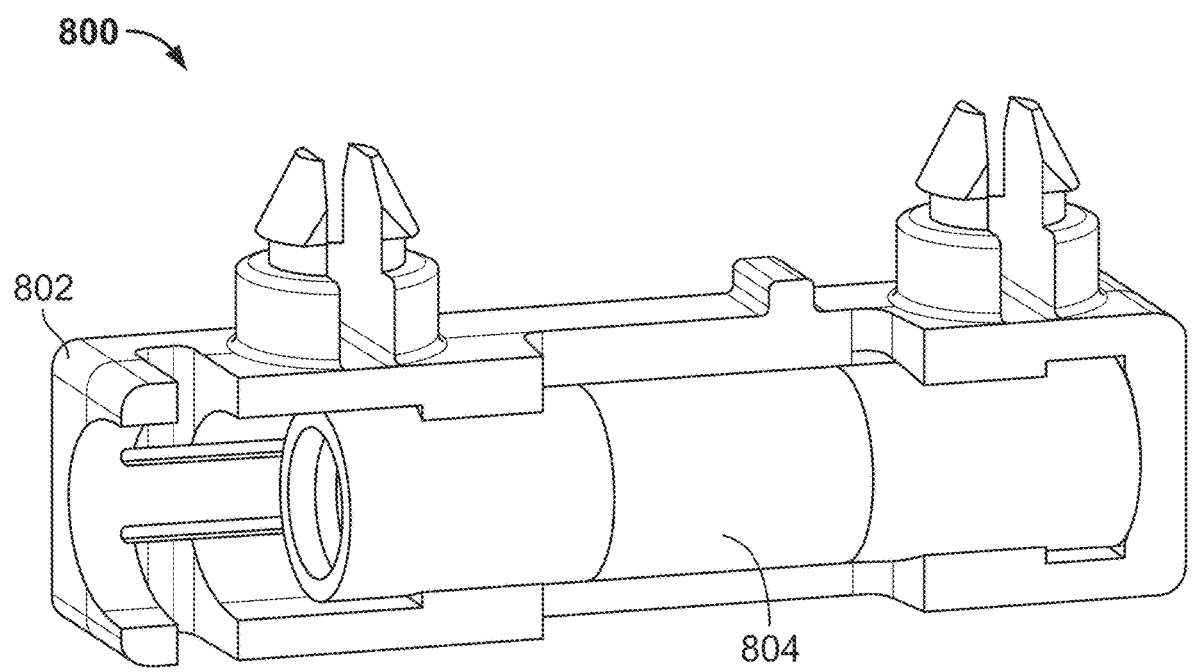
FIG. 31 is a perspective view of a meter socket bubble level for use with a meter socket enclosure.
Figure 32:
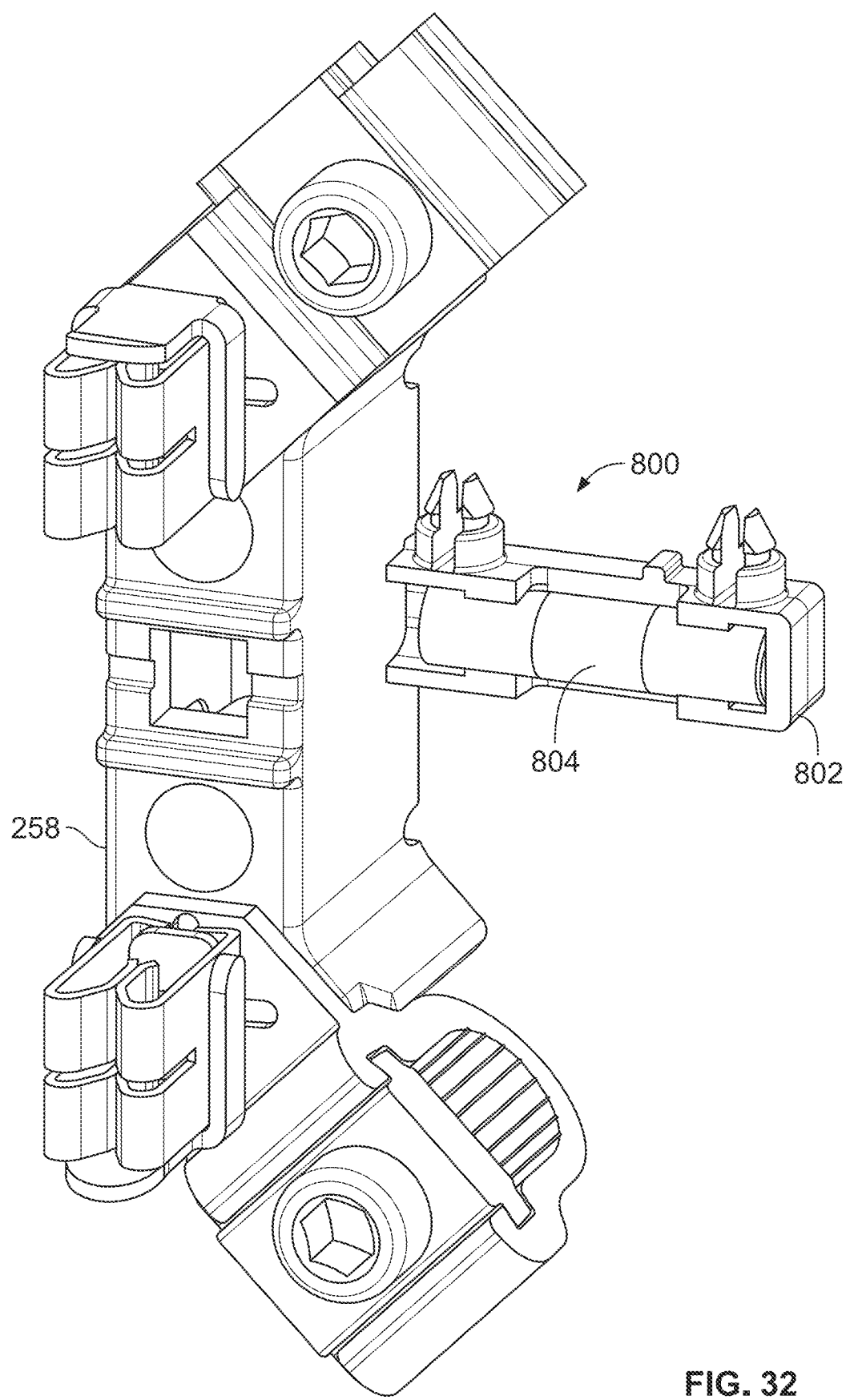
FIG. 32 is a perspective view of the meter socket bubble level shown in FIG. 31 prior to its attachment to a meter jaw block assembly.

FIGS. 31-32 show a bubble level 800 that is adapted for use with a meter socket. The bubble level 800 includes a housing 802 and a level vial 804 retained within a receptacle of the housing 802. As generally known, the level vial 804 encloses fluid and an air bubble that is centered in the level vial 804 when the housing 802 is oriented so that it is horizontal.

Figure 33:
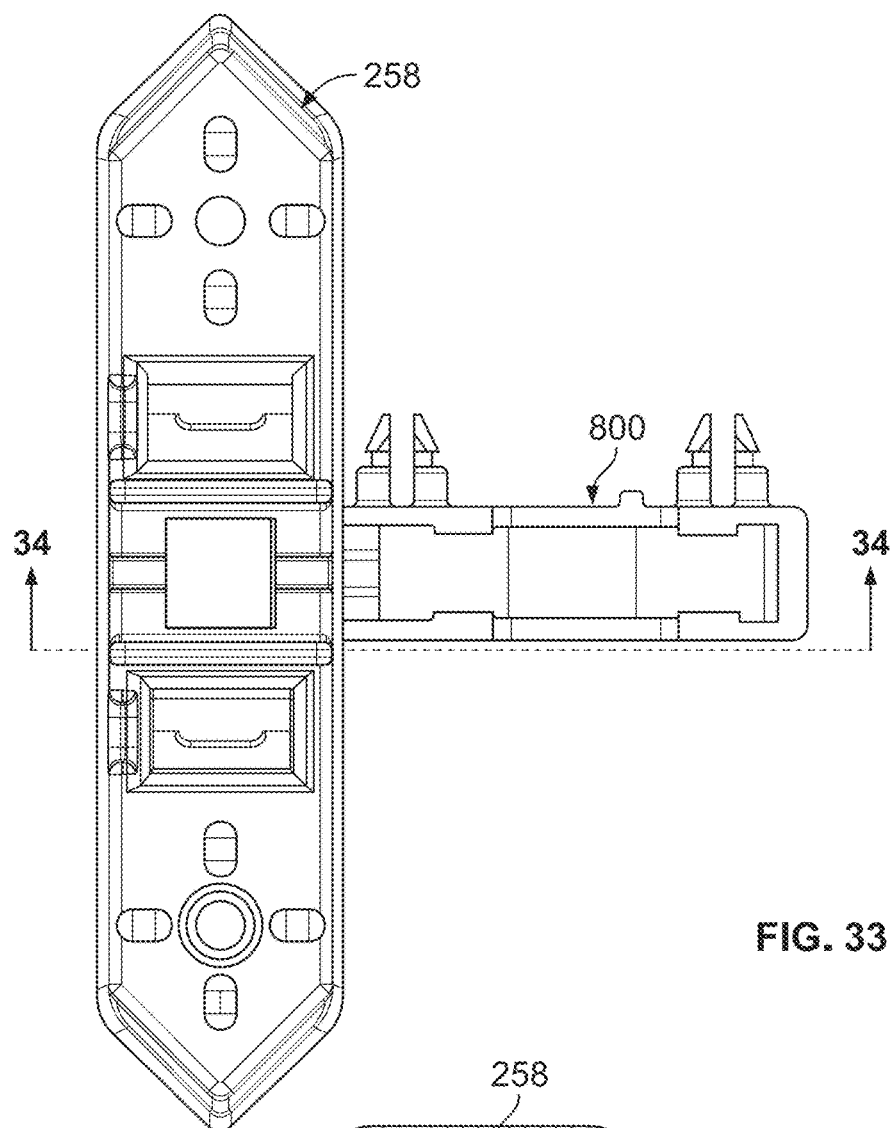
FIG. 33 is a front elevational view showing the meter socket bubble level of FIG. 31 coupled to one of the insulating blocks shown in FIG. 8.
Figure 34:
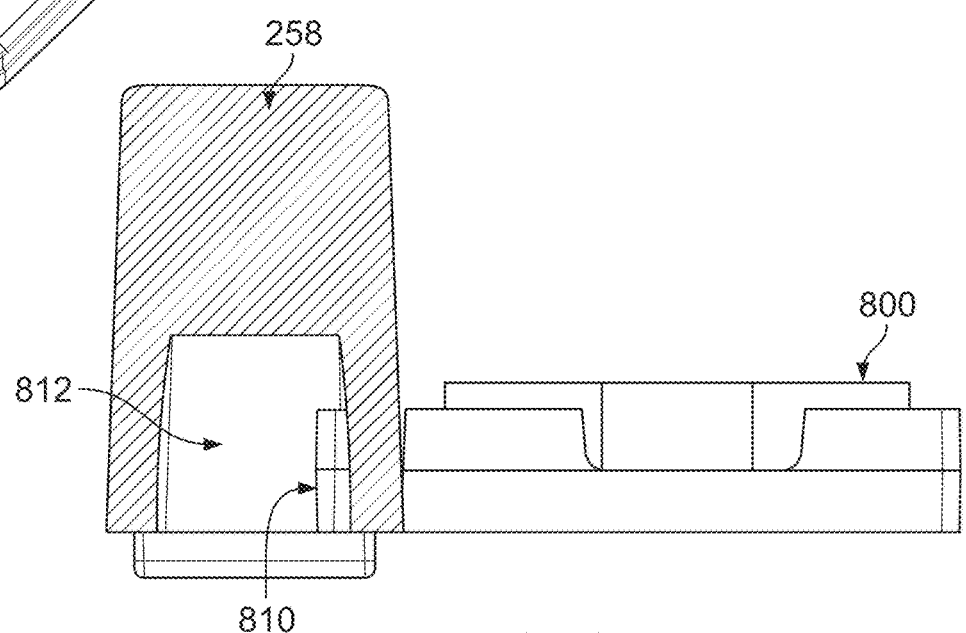
FIG. 34 is a cross-sectional view taken through the line 34-34 of FIG. 33.
Figure 35:
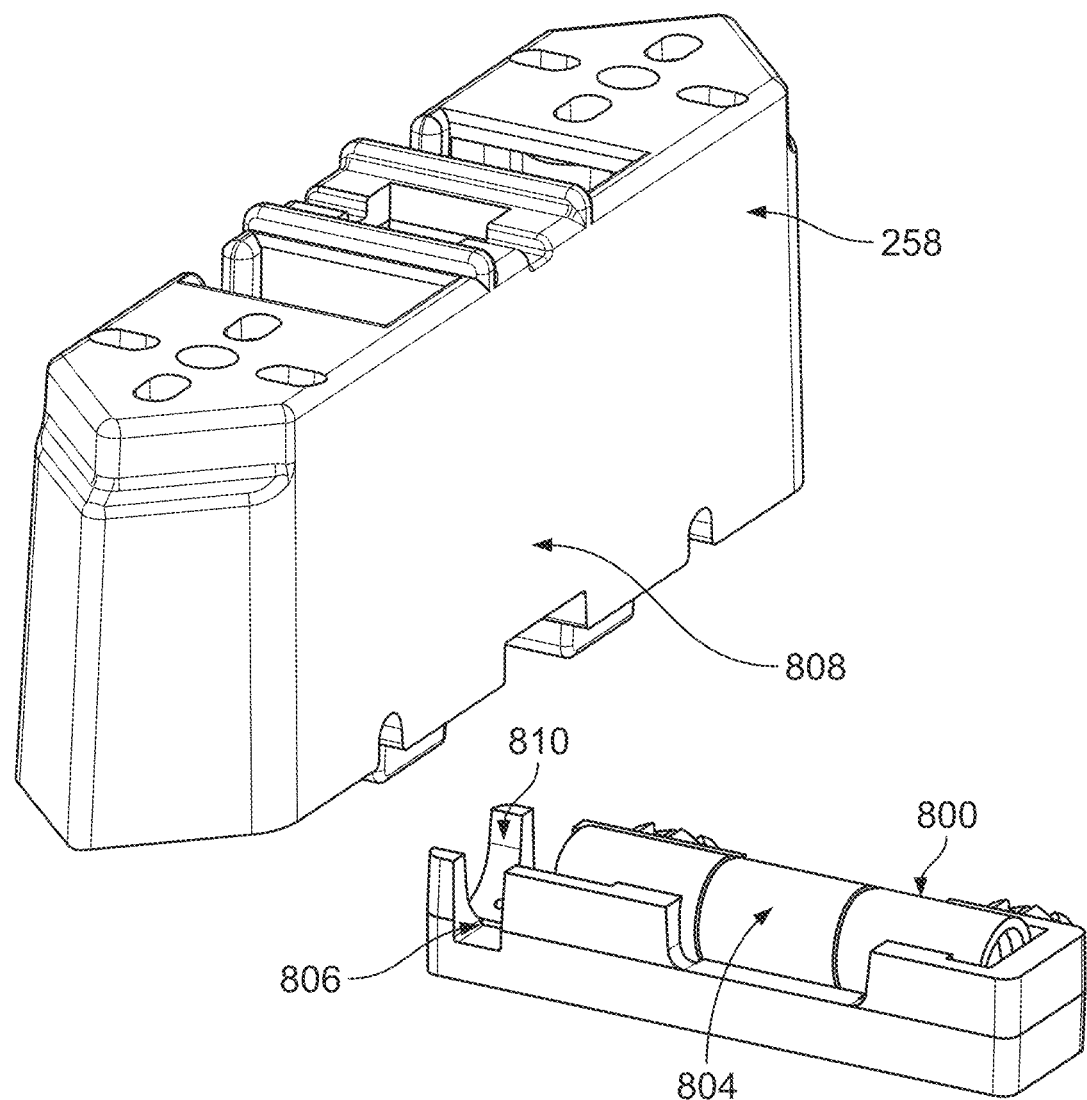
FIG. 35 is an exploded view of the meter socket bubble level and insulating block shown in FIG. 33.

As shown in FIGS. 33-35, the housing 802 is configured for attachment to the insulating block 258 of meter socket 200. When the housing 802 is attached to the insulating block 258, and the insulating block 258 is installed within enclosure 202, the housing 802 and level vial 804 are substantially parallel to the top wall 214 (FIG. 4) of the meter socket 200. The housing 802 includes a slot 806 positioned adjacent an end of the level vial 804 as shown in FIG. 35. The slot 806 is sized and configured to receive a portion of a side wall 808 of the insulating block 258. An end 810 of the housing 802 is further configured to be received within a slot 812 of the insulating block 258, as shown in FIG. 34. When the slot 806 receives the side wall 808 and the end 810 is positioned within slot 812, the insulating block 258 is mounted to an electrical enclosure to fix the bubble level 800 in place with respect to the insulating block 258 and electrical enclosure.

Figure 36:
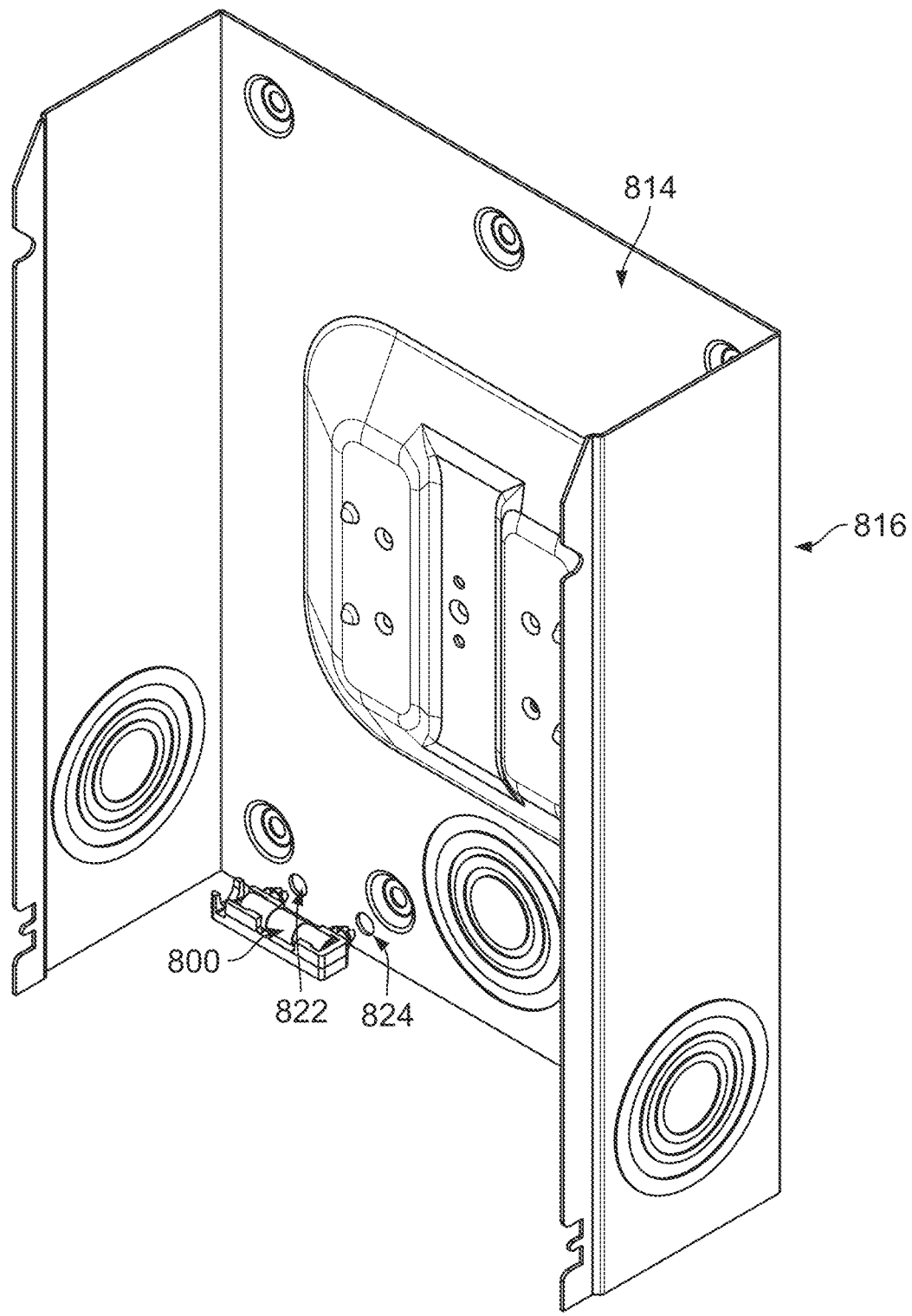
FIG. 36 is a perspective view of a portion of an electrical enclosure showing the meter socket bubble level of FIG. 31 prior to attachment to the electrical enclosure.

As shown in FIGS. 36-37, the housing 802 is also configured for attachment to the back wall 814 of an electrical enclosure 816. When the housing 802 is attached to the back wall 814, the housing 802 and level vial 804 are substantially parallel to a top wall (not shown) of the enclosure 816. The housing 802 attaches to the back wall 814 with two protrusions 818 and 820 (FIG. 37) that are received within holes 822 and 824 (FIG. 36), respectively, formed in the back wall 814. The protrusions 818 and 820 are formed as clips that are able to compress for insertion into the holes 822 and 824, and then expand once inserted to securely mount the bubble level 800 to the back wall 814.

When the housing 802 is attached to the insulating block 258, as shown in FIGS. 33-35, and when the housing 802 is attached to the back wall 208, as shown in FIGS. 36-37, the level vial 804 may be used to determine whether the top wall 214 of the meter socket 200 is substantially horizontal, or level. When the top wall 214 of the meter socket 200 is oriented to that it is horizontal, the air bubble is centered within the level vial 804 giving the user an indication that the top wall 214 of the meter socket 200 is level for installation. Incorporating the bubble level 800 into the meter socket 200 substantially eliminates the need for an installer to use a separate level when attaching meter socket 200 to a surface. The bubble level 800 may be used with other electrical assemblies and enclosures other than meter socket 200.

6. Fourth Exemplary Embodiment of Meter Socket Including an Insulating Block

Referring now to FIGS. 38A-C, an insulating block 900 is shown attached to a riser structure 902 of a meter socket enclosure in accordance with another exemplary embodiment of the invention described herein. Another insulating block 904, which is substantially the same as insulating block 900 is shown prior to its attachment to riser structure 902 in FIGS. 38A-B and attached to riser structure 902 in FIG. 38C. Insulating blocks 900 and 904 and the riser structure 902 may be used with meter socket enclosure 202 in place of the insulating blocks 258 and 264 and riser structure 236. Further, the insulating blocks 900 and 904 and riser structure 902 may be used with other types of electrical assemblies other than a meter socket enclosure.

Insulating blocks 900 and 904 and riser structure 902 are similar to the insulating block 264 and riser structure 236 described above except that the insulating blocks 900 and 904 include a different type of clip than the insulating block 264 and the riser structure 902 includes openings configured to receive the clips on the insulating blocks 900 and 904.

As shown in FIG. 38A, the riser structure 902 includes four attachment structures 906, 908, 910, and 912 in similar positions on the riser structure 902 as the attachment structures 246, 247, 248, and 249 of riser structure 236 shown in FIG. 12. Besides the specific configuration of the attachment structures 906, 908, 910, and 912, the configuration of riser structure 902 is substantially the same as riser structure 236 shown in FIG. 11. Insulating block 900 attaches to attachment structures 906 and 908, as shown in FIGS. 38A-C, and insulating block 904 attaches to attachment structures 910 and 912. Attachment structures 906, 908, 910, and 912 are formed as holes or openings through the front wall 914 of riser structure 902.

Referring to FIG. 38C, insulating block 900 includes two attachment structures 916 and 918 extending outward from its rear surface, and insulating block 904 includes two attachment structures 920 and 922 extending outward from its rear surface. The attachment structures 916 918, 920, and 922 are christmas tree type clips, as best shown in FIG. 38A with respect to attachment structure 920. As shown in FIG. 38A, attachment structure 920 protrudes rearward of the rear surface 924 of insulating block 904. Attachment structure 922 protrudes rearward of the rear surface 924 in a similar manner, and attachment structures 916 and 918 protrude rearward of the rear surface of insulating block 900 in a similar manner. Attachment structure 920 includes two halves extending rearward from rear surface 924 with a gap in between the halves. The two halves squeeze together as attachment structure 920 is pushed through attachment structure 910 permitting the attachment structure 920 to be inserted through the hole in riser structure 902. Once the attachment structure 920 is inserted through the hole, it expands back to its original shape to prevent it from being pulled back through the hole in riser structure 902, thereby securely mounting the insulating block 904 to the riser structure 902. Attachment structures 916, 918, and 922 attach to the riser structure in a similar manner. The insulating blocks 900 and 904 are attachable to the riser structure 902 in a tool-free manner.

Alternatively, the insulating blocks 900 and 904 may be configured to have openings on their rear surface, and the riser structure 902 may be configured to have protrusions, such as christmas tree type clips, that are receivable within the openings of the insulating blocks 900 and 904 to securely mount the insulating blocks 900 and 904 to the riser structure 902 in a tool-free manner.

The specific configuration of the attachment structures 906, 908, 910, 912, 916, 918, 920, and 922 may be used with the meter socket 200, back wall 402, insulating block 500, riser structure 502, electrical assembly 600, and electrical assembly 700 described above in lieu of the attachment structures described above for the meter socket 200, back wall 402, insulating block 500, riser structure 502, electrical assembly 600, and electrical assembly 700.

7. General

The description set forth above provides several exemplary embodiments of the inventive subject matter. Although each exemplary embodiment represents a single combination of inventive elements, the inventive subject matter is considered to include all possible combinations of the disclosed elements. Thus, if one embodiment comprises elements A, B, and C, and a second embodiment comprises elements B and D, then the inventive subject matter is also considered to include other remaining combinations of A, B, C, or D, even if not explicitly disclosed.

The use of any and all examples or exemplary language (e.g., "such as") provided with respect to certain embodiments is intended merely to better describe the invention and does not pose a limitation on the scope of the invention. No language in the description should be construed as indicating any non-claimed element essential to the practice of the invention.

The use of relative relational terms, such as first and second, top and bottom, and left and right, are used solely to distinguish one unit or action from another unit or action without necessarily requiring or implying any actual such relationship or order between such units or actions.

In addition, the recitation of ranges of values in this disclosure is merely intended to serve as a shorthand method of referring individually to each separate value falling within the range. Unless otherwise indicated, each individual value is incorporated into the disclosure as if it were individually recited herein.

The use of the terms "comprises," "comprising," or any other variation thereof, are intended to cover a non-exclusive inclusion, such that a system or method that comprises a list of elements does not include only those elements, but may include other elements not expressly listed or inherent to such system or method.

While the present invention has been described and illustrated hereinabove with reference to several exemplary embodiments, it should be understood that various modifications could be made to these embodiments without departing from the scope of the invention. Therefore, the present invention is not to be limited to the specific configurations or methodologies of the exemplary embodiments, except insofar as such limitations are included in the following claims.

What is claimed and desired to be secured by Letters Patent is as follows:

1. An insulating block configured for use with a meter socket enclosure, comprising:
    a base formed from a material that is an electrical insulator, the base comprising a first attachment structure that is configured to engage a surface of the meter socket enclosure to securely attach the base to the meter socket enclosure, wherein the first attachment structure and the surface of the meter socket enclosure are configured so that the first attachment structure engages the surface of the meter socket enclosure without the use of a tool, the base further comprising a second attachment structure that is configured for attachment to an electrical connector,
    wherein at least a portion of the first attachment structure is configured for insertion into an opening or recess of the meter socket enclosure in a first direction,
    wherein the first attachment structure is configured to move within the opening or recess in a second direction from a disengaged position, in which the first attachment structure does not engage the surface of the meter socket enclosure, to an engaged position, in which the first attachment structure engages the surface of the meter socket enclosure,
    wherein as the first attachment structure moves from the disengaged position to the engaged position, the first attachment structure and the surface of the meter socket enclosure are biased away from each other before snapping into engagement with each other in the engaged position, and
    wherein when in the engaged position, the first attachment structure engages the surface of the meter socket enclosure to prevent the first attachment structure from moving to the disengaged position in a direction opposite the second direction.

2. The insulating block of claim 1, wherein the base comprises a front surface and a rear surface, wherein the first attachment structure is adjacent or formed in the rear surface, and wherein the second attachment structure is adjacent or formed in the front surface.

3. The insulating block of claim 1, wherein one of the meter socket enclosure and the first attachment structure comprises a clip and the other of the meter socket enclosure and the first attachment structure comprises a catch surface configured to engage the clip to securely attach the base to the meter socket enclosure.

4. The insulating block of claim 3, wherein the catch surface is positioned adjacent a second opening of the meter socket enclosure or the first attachment structure, wherein the second opening is configured to receive a portion of the clip.

5. The insulating block of claim 4, wherein when the first attachment structure is in the disengaged position, the clip does not engage the catch surface, and wherein when the first attachment structure is in the engaged position, the clip engages the catch surface.

6. The insulating block of claim 3, wherein the first attachment structure comprises the clip and the meter socket enclosure comprises the catch surface, wherein when the first attachment structure is in the disengaged position, the clip does not engage the catch surface, and wherein when the first attachment structure is in the engaged position, the clip engages the catch surface.

7. The insulating block of claim 6, wherein the base comprises a rear surface, wherein the first attachment structure comprises an upper surface, a first side surface, and a second side surface that each extend outward from the rear surface of the base, wherein the first attachment structure comprises a rear wall that extends between the upper surface, the first side surface, and the second side surface, and wherein the clip extends from the rear wall toward the rear surface of the base.

8. The insulating block of claim 7, wherein a gap between the rear wall of the first attachment structure and the rear surface of the base is configured to receive a portion of the meter socket enclosure comprising the catch surface when the first attachment structure is moved to the engaged position.

9. The insulating block of claim 8, wherein the recess or opening of the meter socket enclosure is a recess positioned above the catch surface, and wherein the clip moves downward from the disengaged position to the engaged position.

10. The insulating block of claim 3, wherein the first attachment structure comprises the catch surface and the meter socket enclosure comprises the clip, wherein when the first attachment structure is in the disengaged position, the clip does not engage the catch surface, and wherein when the first attachment structure is in the engaged position, the clip engages the catch surface.

11. A meter socket comprising:
a meter socket enclosure comprising a first attachment structure; and
an insulating block formed from a material that is an electrical insulator, the insulating block comprising a second attachment structure that is configured to engage the first attachment structure to securely attach the insulating block to the meter socket enclosure, wherein the first attachment structure and the second attachment structure are configured so that the second attachment structure engages the first attachment structure without the use of a tool,
wherein the first attachment structure comprises a catch surface and the second attachment structure comprises a clip configured to engage the catch surface to securely attach the insulating block to the meter socket enclosure,
wherein the meter socket enclosure has a recess or opening positioned adjacent the catch surface, the recess or opening being configured to receive a portion of the second attachment structure, and wherein the second attachment structure is configured to move within the recess or opening from a disengaged position, in which the clip does not engage the catch surface, to an engaged position, in which the clip engages the catch surface, and
wherein the insulating block comprises a rear surface, wherein the second attachment structure comprises an upper surface, a first side surface, and a second side surface that each extend outward from the rear surface of the insulating block, wherein the second attachment structure comprises a rear wall that extends between the upper surface, the first side surface, and the second side surface, and wherein the clip extends from the rear wall toward the rear surface of the insulating block.

12. The meter socket of claim 11, wherein the insulating block comprises a third attachment structure that is configured for attachment to an electrical connector, the third attachment structure adjacent or formed in a front surface of the insulating block.

13. The meter socket of claim 11, wherein the catch surface is positioned adjacent a second opening of the first attachment structure, wherein the second opening is configured to receive a portion of the clip.

14. The meter socket of claim 11, wherein a gap between the rear wall of the second attachment structure and the rear surface of the insulating block is configured to receive a portion of the first attachment structure comprising the catch surface when the second attachment structure is moved to the engaged position.

15. The meter socket of claim 14, wherein the recess or opening of the meter socket enclosure is a recess positioned above the catch surface, and wherein the clip moves downward from the disengaged position to the engaged position.

16. An assembly comprising:
an attachment structure comprising a wall defining an opening, a protrusion formed in the wall adjacent the opening, the protrusion defining a recess in a rear surface of the wall, the attachment structure further comprising a clip extending from the protrusion into the recess; and
an insulating block formed from a material that is an electrical insulator, wherein the insulating block comprises a catch surface that is configured to engage the clip without the use of a tool, wherein the opening is configured to receive a portion of the insulating block comprising the catch surface when the insulating block moves in a first direction, and wherein the portion of the insulating block is configured to move within the opening in a second direction from a disengaged position, in which the clip does not engage the catch surface, to an engaged position, in which the clip engages the catch surface to securely attach the insulating block to the attachment structure, and wherein the insulating block defines a second opening adjacent the catch surface, the second opening configured to receive a portion of the clip when the insulating block is in the engaged position.

17. The assembly of claim 16, wherein the insulating block comprises a front surface and a rear surface, wherein the catch surface is adjacent the rear surface.

18. The assembly of claim 17, wherein the front surface of the insulating block is configured for attachment to an electrical connector.

* * * * *